US012581616B2

(12) United States Patent
Mesher

(10) Patent No.: US 12,581,616 B2
(45) Date of Patent: Mar. 17, 2026

(54) FLUID, SYSTEM AND METHOD FOR IMMERSION COOLING OBJECTS HAVING PLASTICIZED SURFACES

(71) Applicant: ADVANCING CHEMISTRY INC., Calgary (CA)

(72) Inventor: Shaun Mesher, Calgary (CA)

(73) Assignee: ADVANCING CHEMISTRY INC., Calgary (CA)

( * ) Notice: Subject to any disclaimer, the term of this patent is extended or adjusted under 35 U.S.C. 154(b) by 192 days.

(21) Appl. No.: 18/109,176

(22) Filed: Feb. 13, 2023

(65) Prior Publication Data

US 2023/0320026 A1    Oct. 5, 2023

Related U.S. Application Data

(60) Provisional application No. 63/309,870, filed on Feb. 14, 2022.

(51) Int. Cl.
*H05K 7/20* (2006.01)
*C09K 5/20* (2006.01)
*G06F 1/20* (2006.01)

(52) U.S. Cl.
CPC .......... *H05K 7/20236* (2013.01); *C09K 5/20* (2013.01); *G06F 1/20* (2013.01); *H05K 7/20272* (2013.01)

(58) Field of Classification Search
None
See application file for complete search history.

(56) References Cited

U.S. PATENT DOCUMENTS

| | | | |
|---|---|---|---|
| 6,280,659 B1 | 8/2001 | Sundin | |
| 11,725,105 B2 * | 8/2023 | Kim ......................... | C08L 81/02 361/709 |
| 2014/0285967 A1 * | 9/2014 | Wikander ................ | H05K 3/00 361/705 |
| 2015/0291776 A1 * | 10/2015 | Kim ......................... | C08L 79/08 524/168 |
| 2018/0084671 A1 * | 3/2018 | Matsumoto ........ | H05K 7/20772 |
| 2021/0274681 A1 * | 9/2021 | Holland ................ | F28F 13/003 |

FOREIGN PATENT DOCUMENTS

| | | |
|---|---|---|
| CA | 2018118 A1 | 12/1990 |
| CA | 2204273 C | 4/2002 |
| EP | 0497467 A1 | 8/1992 |

OTHER PUBLICATIONS

Chemfoundry, Inc. / Engineered Fluids, "Engineered Fluids BitCool Dielectric Coolants / Heat Transfer Fluids", Safety Data Sheet listed on the Engineered Fluids website: https://www.engineeredfluids.com/safety-data-sheets, Mar. 16, 2020, 8 pages.

(Continued)

*Primary Examiner* — Courtney L Smith

(57) ABSTRACT

A cooling fluid comprising a coolant for immersion cooling an object therein, the object comprising a plasticized surface and a plasticizer dispersed in the coolant, the plasticizer being diffusible into the plasticized surface of the object when the object is in contact with the coolant, wherein a weight ratio of the plasticizer to the coolant in the cooling fluid is at least 0.005.

19 Claims, 29 Drawing Sheets

(56)     References Cited

OTHER PUBLICATIONS

Engineered Fluids Material Compatibility Guide downloaded on Jun. 16, 2022 from: https://www.engineeredfluids.com/material-compatibility, 15 pages.
ExxonMobil Chemical, "Product Safety Summary for EsterexTM Adipate Esters" downloaded from: https://www.exxonmobilchemical.com/dfsmedia/f743208d804841f6ab89a60202cc3f56/2526-source/options/download/esterex-adipate-esters-product-safety-summary?extension=pdf, May 2018, 3 pages.

* cited by examiner

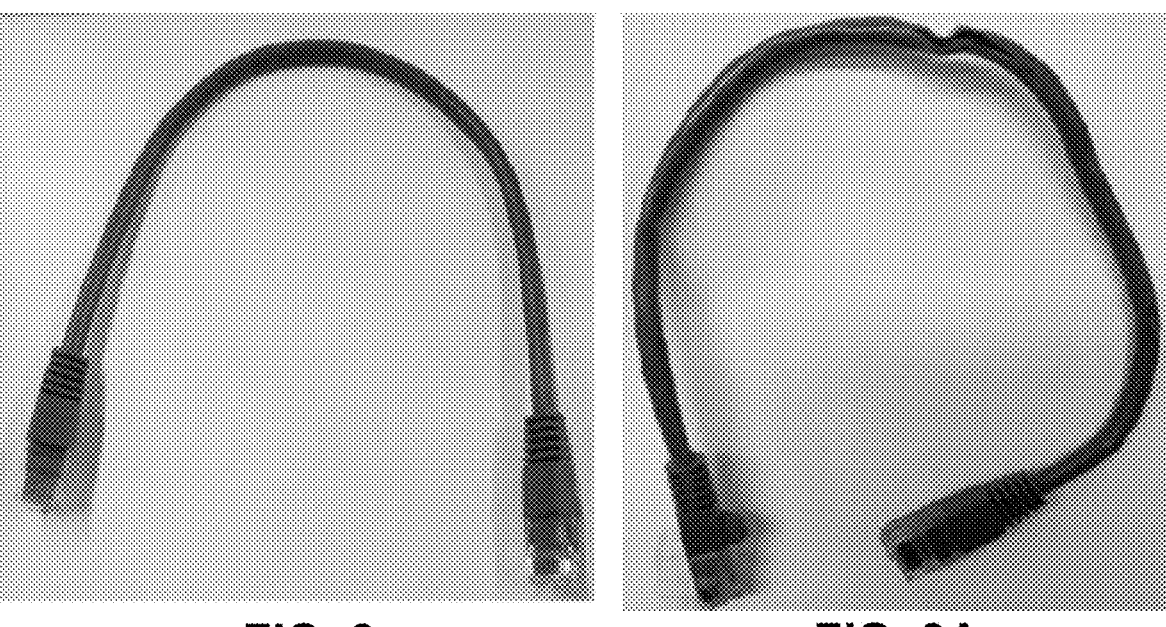
FIG. 2                    FIG. 3A
FIG. 3B

FIG. 8A
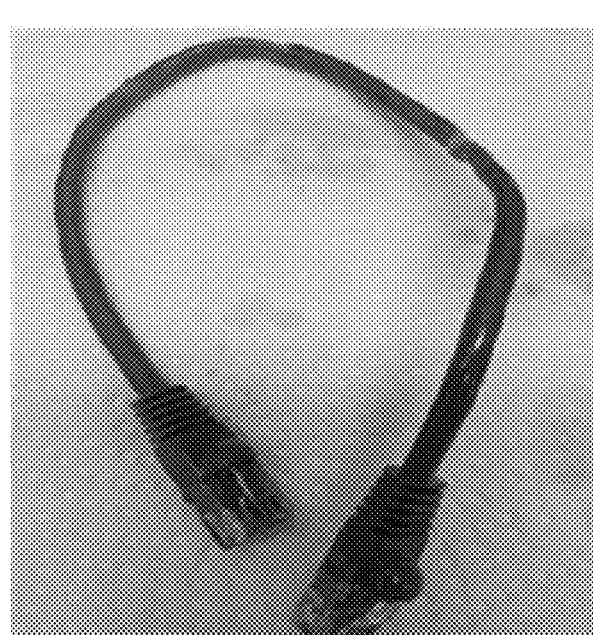
FIG. 8B
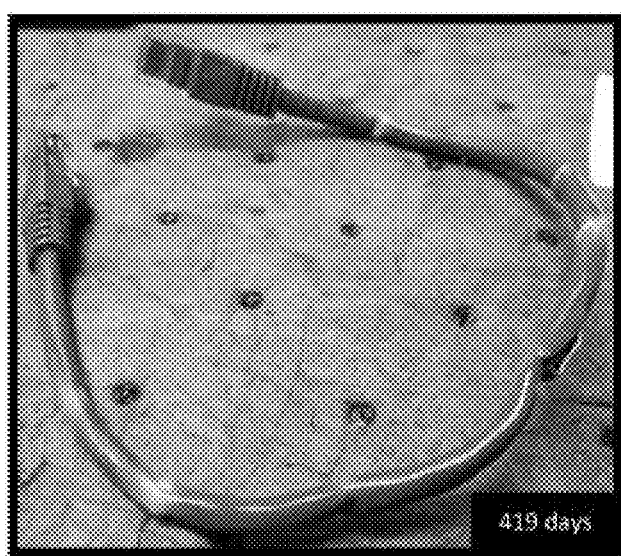
FIG. 8C

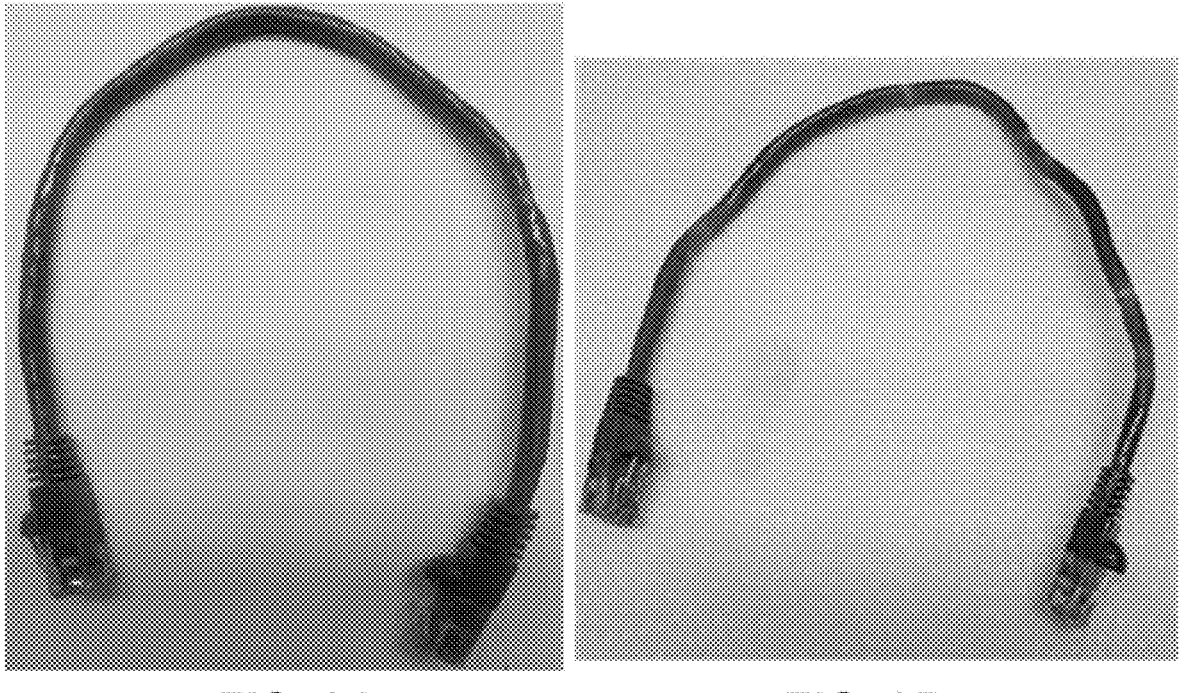
FIG. 9A                    FIG. 9B
FIG. 9C

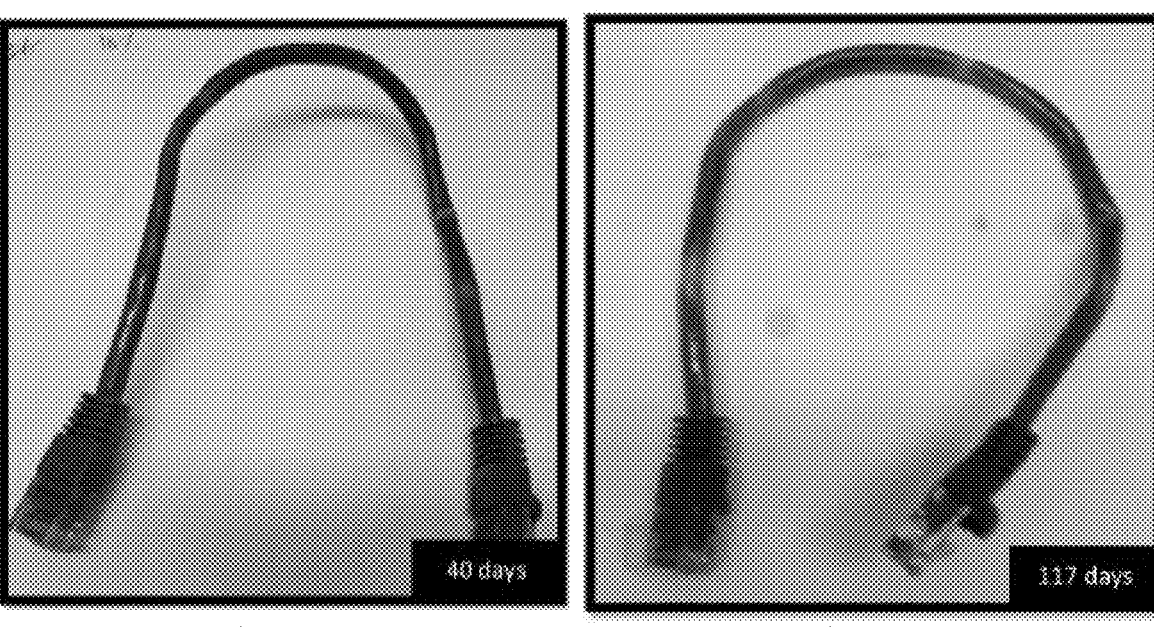
FIG. 12A
FIG. 12B
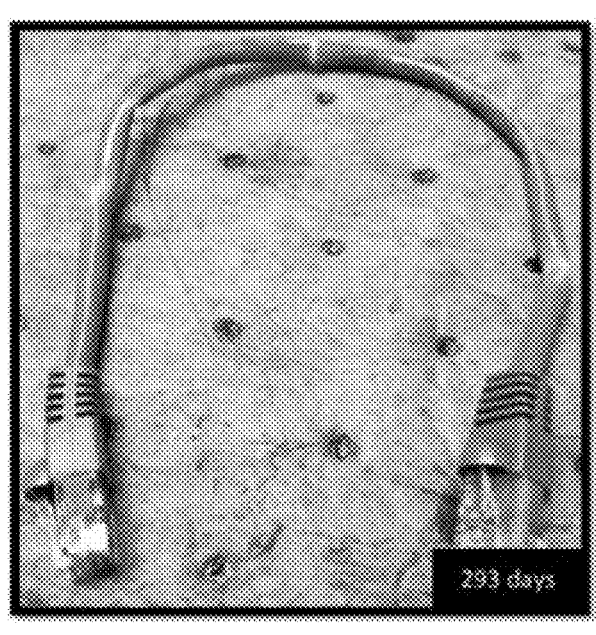
FIG. 12C

FLUID, SYSTEM AND METHOD FOR IMMERSION COOLING OBJECTS HAVING PLASTICIZED SURFACES

CROSS-REFERENCE TO RELATED APPLICATION

This application claims the benefit of U.S. Provisional Patent Application Ser. No. 63/309,870 filed on Feb. 14, 2022. The contents of the aforementioned application are incorporated by reference herein.

FIELD

The present disclosure relates generally to cooling fluids, systems and methods, and specifically to fluids, systems and methods for immersion cooling objects having plasticized surfaces.

BACKGROUND

It is often desirable or necessary to cool electronic devices, which can generate heat during operation. Coolants have been used to cool heat-generating objects in a cooling technique known as immersion cooling.

For example, computing devices including entire computer servers and electronic storage devices may be submerged in a thermally conductive dielectric coolant in liquid immersion cooling for various applications, including mining of cryptocurrencies such as Bitcoin. The cooling fluid is in direct contact with the hot computing devices and components and absorbs heat from the computing devices and components and may be itself then be cooled in a heat exchanger and recirculated. In mining operations, the mining computers operate at high clock speeds for extended periods of time, and the operating temperature of the cooling fluid may be as high as 60° C.

It has been observed that some components of the computing systems immersed in the coolant will degrade during immersion cooling much faster than, for example, in an air-cooled environment. For example, connection cables and wires in the computing system often became less pliable and their outer layers became split and crack over time.

It is thus desirable to provide improved immersion cooling techniques and immersion cooling liquids to reduce degradation of such components.

SUMMARY

In an embodiment, the present disclosure relates to a cooling fluid that comprises a coolant for immersion cooling an object therein, the object comprising a plasticized surface. The cooling fluid also comprises a plasticizer dispersed in the coolant, the plasticizer being diffusible into the plasticized surface of the object when the object is in contact with the coolant, wherein a weight ratio of the plasticizer to the coolant in the cooling fluid is at least 0.005.

In some embodiments, the plasticizer is the same as a plasticizer in the plasticized surface of the object.

In some embodiments, the concentration of the plasticizer in the cooling fluid is the same or higher than a concentration of the plasticizer in the plasticized surface of the object.

In some embodiments, the plasticizer comprises a low molecular weight ortho-phthalate, a high molecular weight ortho-phthalate, a terephthalate, a trimellitate, an aliphatic, a benzoate, a phosphate, or a polymeric plasticizer.

In some embodiments, the low molecular weight ortho-phthalate comprises butyl benzyl phthalate (BBP), dimethyl phthalate (DMP) diethyl phthalate (DEP), diisobutyl phthalate (DIBP), dihexyl phthalate (DHP), di-n-butyl phthalate (DBP), dicyclohexyl phthalate (DCHP), di(2-ethylhexyl) phthalate (DEHP) or di(2-propylheptyl) phthalate (DPHP).

In some embodiments, the concentration of the plasticizer in the cooling fluid is 0.5 wt % to 20 wt % based on a total weight of the cooling fluid. In some embodiments, the concentration of the plasticizer in the cooling fluid is 5 wt % to 15 wt %.

In some embodiments, the coolant comprises an oil.

In some embodiments, the coolant has a density of between 0.800 and 1.100 kg/L at 15° C.

In another embodiment, the present disclosure relates to a cooling system comprising a container comprising a chamber for receiving therein an object to be cooled and the cooling fluid as defined herein in the chamber for immersing the object in the cooling fluid.

In some embodiments, the object comprises a computing device.

In another embodiment, the present disclosure relates to a method of cooling an object comprising a plasticized surface. The method comprises immersing the object in the cooling fluid as defined herein, wherein the plasticized surface is in contact with the cooling fluid.

In some embodiments, the plasticized surface of the object comprises a plasticized polymer.

In some embodiments, the object comprises a computing device.

In some embodiments, the computing device is immersion cooled in the cooling fluid at a temperature of at least 50° C. for at least 30 days.

In another embodiment, the present disclosure relates to a method of forming a cooling fluid for immersion cooling an object, wherein the object comprises a plasticized polymer. The method comprises selecting and providing a coolant suitable for immersion cooling the object and mixing the coolant with a plasticizer to form a mixture, wherein the plasticizer is diffusible into the plasticized polymer when the object is immersed in the mixture.

In another embodiment, the present disclosure relates to the use of a plasticizer in a cooling fluid comprising a coolant for immersion cooling an object having a plasticized surface.

In another embodiment, the present disclosure relates to the use of a cooling fluid as described herein for immersion cooling an object having a plasticized surface.

BRIEF DESCRIPTION OF THE DRAWINGS

In the figures, which illustrate example embodiments:

FIG. 2 is a photograph of a cord;

FIGS. 3A and 3B are photographs of a cord after being immersed in a comparison fluid for 30 days (FIG. 3A) and 120 days (FIG. 3B) respectively;

FIGS. 8A-C are photographs of a cord after being immersed in another comparison fluid for 40 days (FIG. 8A), 117 days (FIG. 8B) and 419 days (FIG. 8C) respectively;

FIGS. 9A-C are photographs of a cord after being immersed in another comparison fluid for 40 days (FIG. 9A), 117 days (FIG. 9B) and 419 days (FIG. 9C) respectively;

FIGS. 12A-C are photographs of a cord after being immersed in another comparison fluid for 40 days (FIG. 12A), 117 days (FIG. 12B) and 293 days (FIG. 12C) respectively;

DETAILED DESCRIPTION

It has been recognized that when computing components, such as wires and cables, with plastic surface layers are in contact with a cooling fluid at elevated temperatures for an extended period of time, degradation due to loss of plasticity can occur faster than in normal conditions or in an air-cooled environment. Without being limited to any specific theory, the present inventor has realized that such accelerated loss of plasticity can result from leaching of plasticizers from the plastic surface layers into the cooling liquid due to increased diffusion of the plasticizer molecules at higher temperatures. The present inventor has also discovered that such loss of plasticity can be reduced or prevented if a suitable plasticizer is added to the coolant. It is thus desirable to provide a cooling fluid that includes a coolant and a plasticizer dispersed in the coolant such that the added plasticizer is diffusible into the plasticized surface of the computing components at the operation conditions, to reduce or even prevent the net loss of plasticizers from the cooled plasticized surface.

Figure 1:
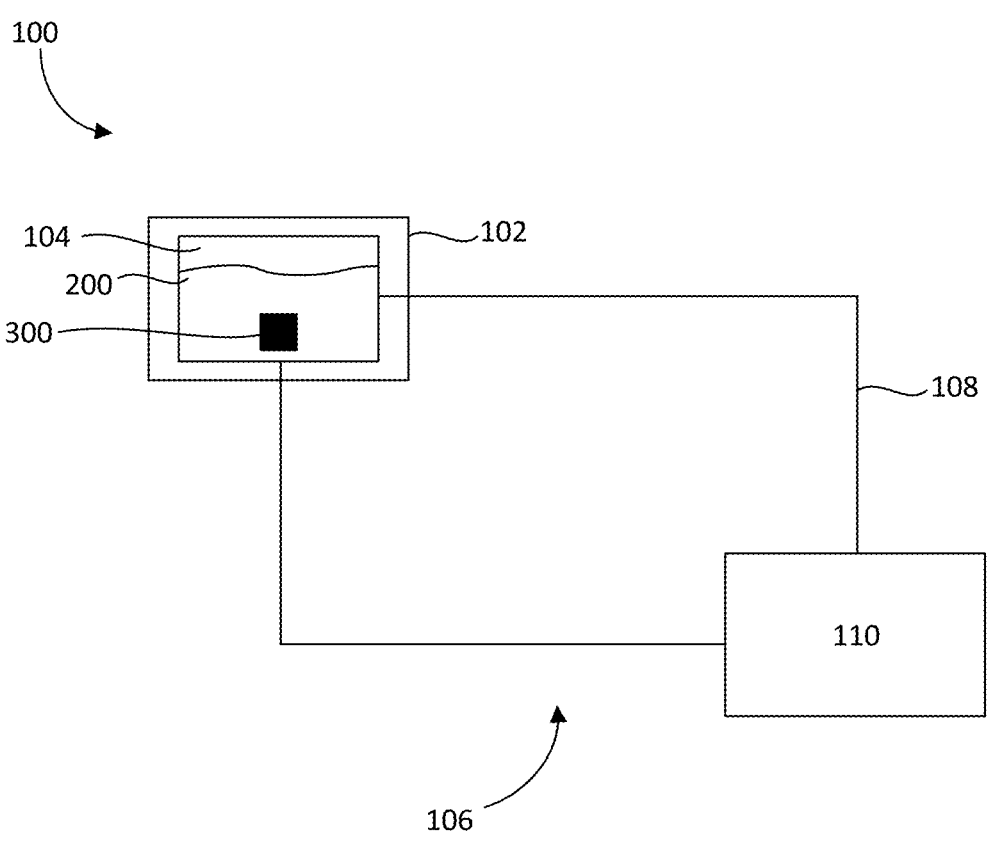
FIG. 1 is a schematic block diagram of a cooling system for immersion cooling one or more objects, according to an example embodiment of the present disclosure.

It may be expected that by reducing or preventing the loss of plasticizers from the cooled plasticizer surface, the loss of plasticity is also reduced or prevented. This in turn may reduce degradation of the computing components, such as by preventing splitting of cracking cause by the reduction in plasticity. In an example embodiment, a cooling system 100 for immersion cooling one or more objects is schematically illustrated in FIG. 1.

System 100 includes a container 102 having a chamber 104, and a cooling fluid 200 contained in the chamber 104. Chamber 104 also houses one or more objects 300 therein. Objects 300 are immersed in cooling liquid 200. Container 102 may be a closed container (e.g., a container with a resealable lid) which may reduce or prevent evaporation of cooling liquid 200 from chamber 104 during operation. In another embodiment, container 102 is an open container.

The system 100 also includes fluid circulation circuit 106, which includes a heat exchanger 110 and one or more conduits 108 connecting the heat exchanger 110 to the container 102 for circulating and cooling the cooling liquid 200. Fluid circulation circuit 106 is typically a closed fluid circuit.

The cooling fluid 200 includes a coolant and a plasticizer. The coolant may preferably be a fluid having high thermal conductivity and no or low electrical conductivity (i.e., an electric insulator such a dielectric fluid).

The coolant in the cooling liquid 200 is selected for immersion cooling particular objects, such as electronic or computing devices and components. Depending on the types of the objects 300 to be cooled and the particular application of immersion cooling, the coolant may be readily selected by those skilled in the art from known coolants. For example, for computer mining operations, typical coolants may include dielectric fluids, such as a perfluorinated compounds, a polyalphaolefin (PAO) fluid, an aliphatic fluid, an aromatic fluid, or a silicone oil.

The coolant may be a hydrocarbon fluid, such as a blend of one or more aliphatic and aromatic fluids which include hydrocarbons ranging from $C_{10}$-$C_{50}$. An aliphatic hydrocarbon in an aliphatic fluid may be a straight or branched chain alkane or olefin. The aliphatic fluid may include butane, pentane, cyclopentane, hexane, cyclohexane, heptane, octane, nonane, decane, undecane, or dodecane. An aliphatic solvent may also be used, which may be any suitable blend of more than one aliphatic solvents such as gasoline, diesel, petroleum distillate, petroleum ether, mineral spirits, naptha, mineral oil, kerosene, or turpentine. The aliphatic fluid may be a synthetic aliphatic fluid such as a polyalphaolefin (PAO)

The coolant may be group II, II+, III, IV or V base oil or a blend of more than one group II, II+, III, IV or V base oils.

The coolant may be made from a renewable source, such as an ester of a vegetable oil.

The coolant may include a hydrotreated petroleum distillate, such as Neutral Oil 60R sold by Chevron.

The coolant may have a density of between about 0.800 and about 1.100 kilograms/litre (kg/L) at 15° C.

The coolant may have a flash point greater than about 93° C., as measured by the American Society for Testing and Materials (ASTM) D93 standard test method. The flash point may be greater than about 150° C.

The coolant may have a viscosity index (VI) between about 60 and about 300.

The coolant may be an oil with a viscosity of about 1 mPa·s. at 40° C. The use of a low viscosity oil as the coolant may be beneficial as lower viscosity fluids will flow faster under the same physical conditions, thereby removing heat faster from the immersed object.

The oil may be substantially free of preservatives and antioxidants, because such additives could contribute to the emulsification of water from the atmosphere with the coolant, especially over a prolonged period of time at elevated temperatures. Including water in the cooling fluid is undesirable because water emulsified with the coolant oil can reduce the efficiency of the coolant and can also lead to corrosion of some immersed objects.

In the cooling fluid, a plasticizer is dispersed in the coolant. As used herein, a plasticizer refers to a substance that has been added to another material to increase the plasticity of the other material, or render the other material softer and more flexible. Plasticizers are typically organic compounds that are added to polymeric materials such as plastic and rubber to improve the plasticity and flexibility of the material. Depending on the types of the objects 300 to be cooled and the coolant selected, the plasticizer may be readily selected by those skilled in the art from known plasticizers.

In the cooling liquid, the plasticizer is selected and dispersed in a manner that allows the molecules of the plasticizer to diffuse in the cooling liquid and into a plasticized surface that is in contact with the cooling liquid.

The concentration of the plasticizer in the cooling liquid 200 should be high enough so it is sufficient to reduce or prevent net loss of plasticizer from the plasticized surfaces of objects 300 that are in contact with the cooling liquid 200. For example, the weight ratio of the plasticizer to the coolant in the cooling fluid 200 may be at least 0.005, such as from 0.005 to about 0.2, from 0.005 to about 0.1, or from about 0.05 to about 0.1.

The concentration of the plasticizer in the cooling fluid may be the same as, or higher than, the concentration of the plasticizer(s) in the plastic components to be cooled.

According to an embodiment, the weight ratio of the plasticizer to the coolant in the cooling fluid is at least 0.005. In other embodiments, the weight ratio of the plasticizer to the coolant in the cooling fluid is at least 0.01, or at least 0.02, or at least 0.04, or at least 0.06, or at least 0.08, or at least 0.10, or at least 0.12, or at least 0.14, or at least 0.16, or at least 0.18, or at least 0.20.

For some applications, the cooling fluid may contain at least about 0.5 wt % plasticizer, based on the total weight of cooling fluid for example, at least about 2 wt % plasticizer, at least about 4 wt % plasticizer, at least about 6 wt % plasticizer, at least about 8 wt % plasticizer, at least about 10 wt % plasticizer, at least about 12 wt % plasticizer, at least about 14 wt % plasticizer, at least about 16 wt % plasticizer, at least about 18 wt % plasticizer, or at least about 20 wt % plasticizer based on the total weight of the cooling fluid.

The plasticizer may include one or more of: a low molecular weight ortho-phthalate, a high molecular weight ortho-phthalate, a terephthalate, a trimellitate, an aliphatic, a benzoate, a phosphate, or a polymeric plasticizer.

The plasticizer may be a low Molecular weight orthophthalate (i.e., those having alkyl chains of 1 to 6 carbon atoms in length) for example, butyl benzyl phthalate (BBP), dimethyl phthalate (DMP) diethyl phthalate (DEP), diisobutyl phthalate (DIBP), dihexyl phthalate (DHP), di-n-butyl phthalate (DBP), dicyclohexyl phthalate (DCHP), di(2-ethylhexyl) phthalate (DEHP) or di(2-propylheptyl) phthalate (DPHP).

The plasticizer may also be a high Molecular weight ($C_{7+}$) ortho-phthalate (i.e., those having alkyl chains of 7 or more carbon atoms in length) such as, for example: diisoheptyl phthalate, dicapryl phthalate (DCP), diisooctyl phthalate, diisononyl phthalate (DIDP), diisodecyl phthalate (DIDP), diisoundecyl phthalate (DIUP), diundecyl phthalate (DUP) or ditridecyl phthalate (DTDP).

The plasticizer may be a terephthalate such as, for example: dibutyl terephthalate (DBT), di-tert-butyl terephthalate (DTP), bis(2 ethyl hexylterephthalate) (DEHT) or dioctyl terephthalate (DOTP).

The plasticizer may be a trimellitate such as, for example: tri-(2-ethylhexyl) trimellitate (TEHTM), triisononyl trimellitate (TINTM), tri-isodecyl trimellitate (TIDTM), triisotri-decyl trimellitate (TITDTM), trioctyl mellitate (TOTM), triisononyl trimellitate (TIOTM), tricapryl trimellitate or tri (n-octyl, n-decyl) trimellitate (NODTM)

Aliphatic plasticizers may include, adipates, sebacates, azelates, cyclohexanoates and citrates.

The plasticizer may be an adipate, such as, for example: diisobutyl adipate, di(2-ethylhexyl) adipate (DEHA), dicapryl adipate (DCA), di(n-heptyl, n-nonyl) adipate, dii-sononyl adipate (DINA), diisodecyl adipate (DIDA), or ditridecyl adipate (DTDA).

The plasticizer may be a sebacate, such as, for example: di-methyl sebacate (DMS). dibutyl sebacate (DBS), di-(2-ethylhexyl) sebacate or di-octyl debacate (DOS).

The plasticizer may be an azelate, such as, for example: Dimethyl azelate, di-n-hexyl azelate (DNHZ), di(2-ethyl-hexyl) azelate (DOZ), diisooctyl azelate (DOA) or diiso-decyl azelate.

The plasticizer may be a cyclohexanoate such as, for example: 1,2-cyclohexane dicarboxylic acid diisononyl ester (DINCH) or di-octyl cyclohexanoate (DOCH).

The plasticizer may be a citrate, such as, for example: Triethyl citrate (TEC), acetyltributyl citrate (ATBC) or tributyl citrate (ATBC).

The plasticizer may be a benzoate such as, for example: isononyl benzoate (INB), isodecyl benzoate (IDB), diethyl-ene glycol dibenzoate, dipropylene glycol dibenzoate, neo-pentyl glycol dibenzoate or tri-ethylene glycol dibenzoate.

The plasticizer may be a phosphate, such as, for example: tris(2-ethylhexyl) phosphate, 2-ethylhexyl diphenyl phos-phate, tricresyl(methyl phenyl) phosphate (TCP) or tributyl phosphate (TBP).

The plasticizer may be a polymeric plasticizer such as, for example: a polyester of an aliphatic dicarboxylic acid, such as (hexanedioic acid, polymer with 2,2-dimethyl-1,3-pro-panediol and 1,2-propanediol, isononyl ester), (hexanedioic acid, polymer with 1,2-propanediol, octyl ester) or (hexane-dioic acid, polymer with 1,2-propanediol, acetate).

The object(s) 300 may be any device having one or more heat-generating components that may require cooling. When an object 300 has at least one plasticized surface that is exposed and in contact with the cooling liquid during immersion cooling, cooling liquid 200 may be beneficially used. For example, the object may be an electronic device, or components of an electronic device, such as a computing system or a server.

The objects 300 may include exposed plasticized sur-faces, such as plastic cover layers on wires, cables, and other plastic components.

The plasticized surface of object 300 may be the surface of other components of an electronic device, such as con-nectors, capacitors, structural components (i.e., mounting brackets, frames) and o-rings. Such components may be manufactured from acrylonitrile butadiene styrene (ABS), high impact polystyrene (HIPS), polycarbonate and poly-ethylene terephthalate (PET).

In an embodiment, the object 300 may include a cable, which is submerged in the cooling fluid 200. Such cables may include one or more conductive cores, encased in a plastic coating. The plastic coating may be made be made, for example, from polyvinyl chloride (PVC), polyethylene, cross-linked polyethylene, polypropylene, ethylene chloro-trifluorethylene (ETCFE), Nylon and polyvinylidene fluo-ride (PVDF).

As is well known, di(2-ethylhexyl) phthalate (DEHP) is commonly added to PVC. The amount of plasticizer in the plastic may affect the plasticity and flexibility of the plastic.

For example, a reduction in the plasticizer concentration in the plastic may undesirably cause the polymeric material to become more brittle, and prone to splitting or cracking which may lead to decreased performance or even failure.

When a PVC material is in contact with a coolant, the plasticizer in the PVC material may be leached out of the PVC material. Without being limited to any particular theory, it is expected that when the PVC material is immersed in a coolant without any added plasticizer, there will be net diffusion of the plasticizer from areas of rela-tively high plasticizer concentration in the PVC material to an area of relatively low plasticizer concentration in the coolant. The net effect of the molecular diffusion may be removal or loss of a substantial portion of the plasticizer originally contained in PVC material.

By providing a cooling fluid 200 with a plasticizer dis-persed within the cooling fluid, the net loss of the plasticizer from the PVC or other plasticized surfaces, may be reduced or prevented as the concentration of plasticizer in the cooling fluid is increased. Through preventing loss of plas-ticizer from the plasticized surface, splitting or cracking of plastic components may be prevented and the plastic will maintain its plasticity and flexibility.

For example, if the concentration of the plasticizer in the cooling fluid 200 is sufficiently high, such as being higher than the initial concentration of the plasticizer in the plas-ticized surface of the objects 300, net loss of plasticizer from the cooled object 300 may be prevented. Even at a lower added plasticizer concentration, the net loss of plasticizer from the cooled object 300 may still be reduced as the diffusion rate of the plasticizer towards the cooling fluid 200 is still reduced due to the decreased concentration gradient. Further, the concentration gradient may even be reversed, i.e., the cooling fluid 200 has a relatively high plasticizer concentration and the plasticized surface has a relatively low plasticizer concentration, such that more plasticizer may diffuse into the plasticized surface from the cooling fluid 200. This reverse concentration gradient may provide replacement or replenishment of the plasticizer in the plas-ticized surface.

The plasticizer dispersed in the coolant may be selected from plasticizers that are typically added to polymers for altering the properties of the plastic materials formed from the polymers. A suitable plasticizer is dispersible within the coolant such that the plasticizer is available for diffusion into the plasticized surface of the object when the object is in contact with the coolant. The plasticizer may be partially or fully miscible with the coolant such that they form a homogenous mixture. The plasticizer and the coolant may be in separate phases, with the plasticizer evenly dispersed within the coolant. The plasticizer and the coolant may form an emulsion.

In an embodiment, the plasticizer in the plasticized sur-face of the object is the same as the plasticizer dispersed in the coolant. For example, the plasticized surface may be the outer surface of a PVC coated cable, such as an ethernet cable. The PVC may include DEHP as a plasticizer and the cooling fluid may also include DEHP dispersed within the coolant.

In some applications, the plasticized surface of the cooled objects may contain a mixture of more than one plasticizer and the cooling fluid 200 may also include a mixture of the same plasticizers dispersed in the coolant.

The concentration of the plasticizer in the cooling fluid 200 may be the same or higher as the concentration of the plasticizer in the plasticized surface of the object 300. For example, where the plasticized surface is the outer surface of a PVC coated cable and the PVC has a plasticizer concentration of 10 wt %, based on the total weight of the PVC, the cooling fluid may have 10 wt % or greater that 10 wt % plasticizer dispersed in the coolant based on the total weight of the cooling fluid.

The cooling fluid 200 may be prepared by any suitable method. For example, a coolant suitable for immersion cooling the particular object(s) to be cooled may be selected based on a number of known factors, such as the anticipated temperature of the cooling fluid when cooling the object(s), the materials of the object(s) that will be exposed to the cooling fluid and the anticipated lifespan of the cooling fluid (i.e., the run time before replacement of the cooling fluid).

A suitable plasticizer and target concentration range of the plasticizer in the final liquid are also selected and determined, depending on the particular objects to be cooled. For example, the plasticizer may be selected based on factors such as the plasticizers(s) in the object(s) to be cooled, the anticipated temperature of the cooling fluid when cooling the object(s), the anticipated lifespan of the cooling fluid (i.e., the run time before replacement of the cooling fluid) and the compatibility of the plasticizer with the selected coolant at the selected target concentration range The target concentration range of the plasticizer may be selected based on factors such as the surface area of plasticized surface of the objects(s) that is exposed to the cooling fluid and the concentration of plasticizer(s) within the plastic components of the object(s) to be cooled.

The selected coolant and plasticizer may be mixed by any suitable method to form a mixture. The mixture is prepared in such a way that at least some of the plasticizer molecules in the liquid mixture are free to move or diffuse through the liquid so that the plasticizer is diffusible into an object in contact with or immersed in the liquid mixture.

During immersion cooling, the cooling fluid 200 may partially or fully immerse the object 300 to be cooled in the container 102.

Object 300 may include a computer, or heat generating components of a computer. Such components may include application specific integrated circuits (ASICs) or graphics processing units (GPUs).

As can be appreciated, by reducing or preventing net loss of plasticiser from the plasticized surface, the plasticity and flexibility of the plastic surface material can be maintained at a desired level for a longer period of time.

For example, computing components may be immersed in cooling fluid 200 for longer periods of time and/or at higher temperatures whilst the plasticity and flexibility of plastic components is maintained at a desired level. This will beneficially reduce splitting and cracking and may increase life span of plastic components, which in turn reduces downtime caused by maintenance and component failure The cooling fluids of the present disclosure may be used in computer mining, where it is desirable run computers at a high clock rate, that is at a rate exceeding that certified by the manufacturer. This will further increase the heat generated by the computer. Furthermore, multiple computers may be placed in close proximity to one another, further increasing the heat generated. By providing a cooling fluid as described herein for immersion cooling one or more computers, the computers can be run at a high clock rate for prolonged periods or time whilst the degradation of plastic components that are immersed in the cooling fluid is reduced or prevented.

Example 1A (Comparison)

A low-density polyethylene (PE-LD) cord was submerged in DRILLSOL™ Plus at 50-75° C. for 120 days.

A photograph of the cord before immersion is shown in FIG. 2.

After the immersion period, the cord was taken out and bent, and immediately snapped upon bending and a large area of the cord became exposed. The cord was also very stiff and difficult to bend. A photograph of the cord after being immersed in DRILLSOL™ Plus for 30 days and after bending is shown in FIG. 3A. A photograph of the cord after being immersed in DRILLSOL™ Plus for 120 days is shown in FIG. 3B.

Example 1B

Each low-density polyethylene cord (PE-LD) cord was submerged in a sample cooling solution containing DRILLSOL Plus as the coolant and di(2-ethylhexyl) phthalate (DEHP) as the plasticizer at 50-75° C. for 120 days. The sample cooling solutions tested were: (A) 1.0 v/v % di(2-ethylhexyl) phthalate in DRILLSOL Plus; (B) 5.0 v/v % di(2-ethylhexyl) phthalate in DRILLSOL Plus; and (C) 10.0 v/v % di(2-ethylhexyl) phthalate in DRILLSOL Plus.

Samples A, B, and C were prepared by adding 4.5 mL, 22.5 mL, and 45.0 mL of DEHP to sufficient DRILLSOL Plus to provide a total volume of 450 mL. Each mixture was vigorously shaken until the solution appeared homogeneous.

Figure 4B:
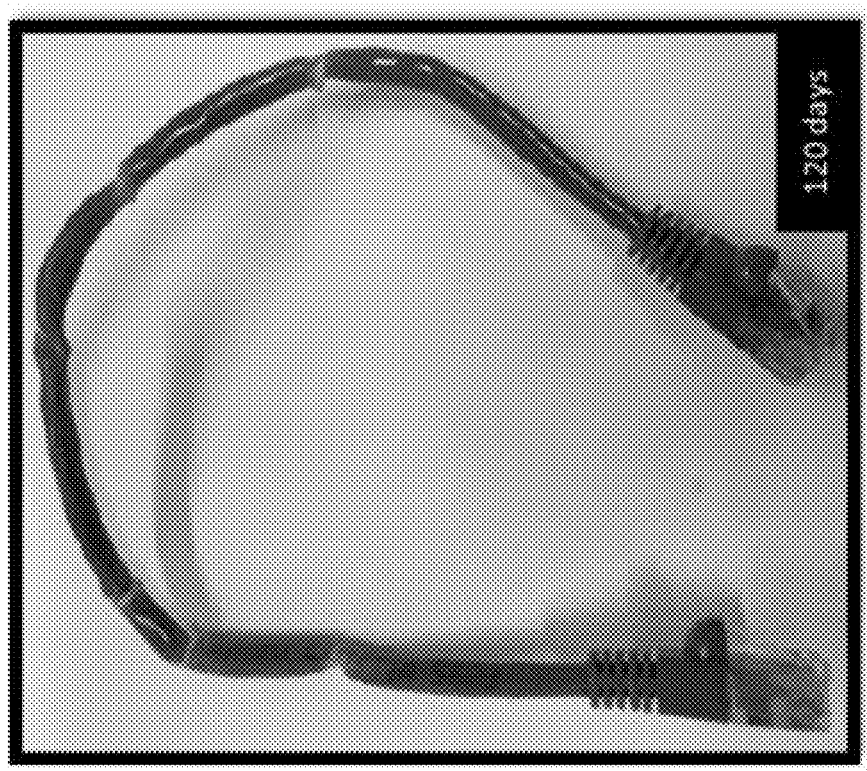
FIGS. 4A and 4B are photographs of a cord after being immersed in a cooling fluid according to an embodiment of the present disclosure for 30 days (FIG. 4A) and 120 days (FIG. 4B) respectively.
Figure 4A:
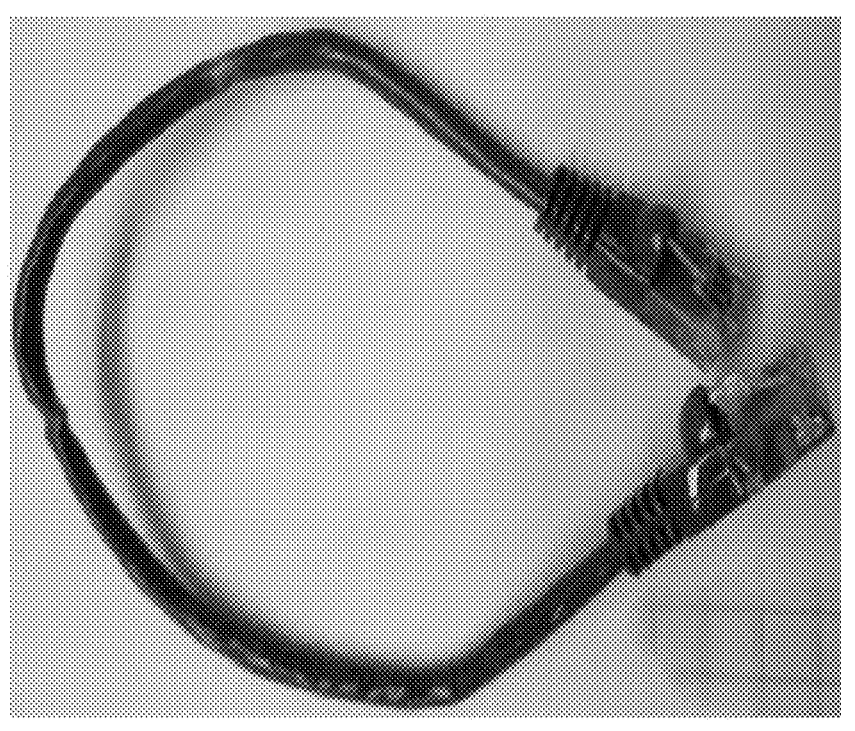
Figure 5B:
FIGS. 5A and 5B are photographs of a cord after being immersed in a cooling fluid according to an embodiment of the present disclosure for 30 days (FIG. 5A) and 120 days (FIG. 5B) respectively.
Figure 5A:
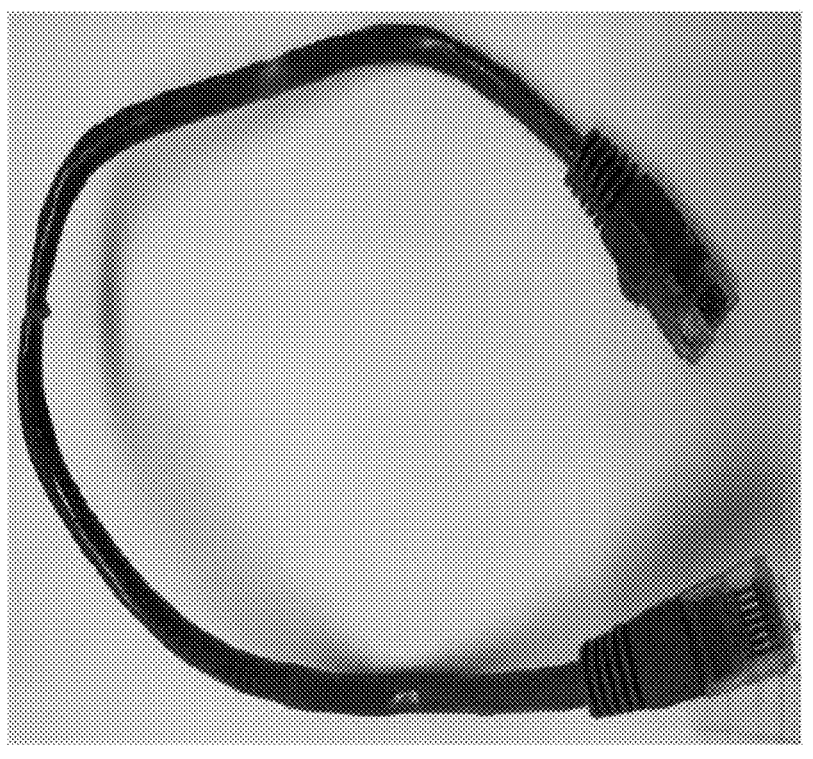
Figure 6B:
FIGS. 6A and 6B are photographs of a cord after being immersed in a cooling fluid according to an embodiment of the present disclosure for 30 days (FIG. 6A) and 120 days (FIG. 6B) respectively.
Figure 6A:
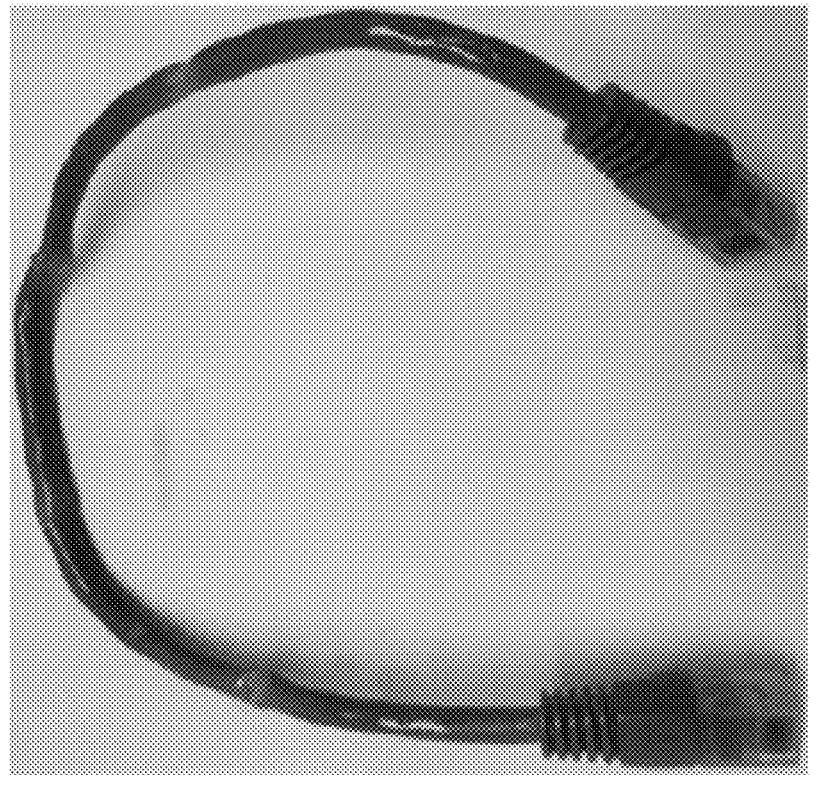

The samples were then transferred to glass jars and a test cord was submerged in each mixture before each jar was covered. Each jar was placed in a water bath between a temperature of 50-75° C. for 120 days. The cords were observed visually and physically examined. Photographs of the cords immersed in Samples A, B, C after 30 days are shown in FIGS. 4A, 5A, 6A. Photographs of the cords immersed in Samples A, B, C after 120 days are shown in FIGS. 4B, 5B and 6B. Observations of these samples and the Comparison Sample are listed in Table 1.

TABLE 1

| | Observations at Specified Loading of Plasticizer | | | |
|---|---|---|---|---|
| Time (days) | Comparison Sample (0 v/v %) | Sample A (1.0 v/v %) | Sample B (5.0 v/v %) | Sample C (10.0 v/v %) |
| 30 | The cord was very stiff and hard to bend. When bent, the cord snapped, thereby exposing quite a bit of the wire. | Cord was relatively hard to bend. A small amount of cracking was visible near the bottom of the cord after bending it. Bending left a lot of lasting indents. | Cord was relatively difficult to bend though no snapping was visible. A few indents were left on the cord after bending. | Cord was still quite stiff but not as hard to bend as the former cords. No matter how many times it was bent, the cord did not snap. |

TABLE 1-continued

| | Observations at Specified Loading of Plasticizer | | | |
|---|---|---|---|---|
| Time (days) | Comparison Sample (0 v/v %) | Sample A (1.0 v/v %) | Sample B (5.0 v/v %) | Sample C (10.0 v/v %) |
| 120 | The cord is extremely stiff and difficult to bend. When the cord was bent, more of the wire became exposed. There are a lot of marks where the cord was bent previously. | The cord is still extremely hard to bend and is very stiff. However, no more cracking had been observed when bent more. More indents did occur where the cord was newly bent. | The cord is less stiff than the former and easier to bend but it was still quite difficult to bend. Lots of visible indents/ marks but no cracking or exposing of the wire seen. | Cord is still relatively stiff but less so than the former. Cord is the easiest to bend of the bunch and there was no cracking seen when repeatedly bended. There are less indents/ marks than the former. |

It was observed that when 1.0 v/v % of DEHP had been added to the DRILLSOL Plus (Sample A), cracking was minimal but still present. The cord was still relatively difficult to bend, but not as tough as for the Comparison Sample. When bending, the cord had numerous lasting indents (FIG. 4A) in which one of them left a tiny crack.

With Sample B (5.0 v/v % of DEHP added to the DRILLSOL Plus), the cord was still relatively difficult to bend though no snapping or cracks were visible after continuous bending (FIG. 5A).

With Sample C (10.0 v/v % DEHP in DRILLSOL Plus), however, had outperformed the former mixtures. The higher concentration of plasticizer allowed the cord to remain in better shape for a longer period by helping the cord to remain relatively flexible. The cord was the easiest to bend, though still difficult and the plasticizer prevented the cord from snapping or cracking when continually bent (FIG. 6A).

It was observed that, in general, deterioration of the cords lessened as a greater amount of DEHP was added to the DRILLSOL Plus.

Example 2A (Comparison)

A low-density polyethylene (PE-LD) cord was submerged in Chevron Neutral Oil 60R at 55-60° C. for 419 days.

Figure 7A:
FIGS. 7A-C are photographs of a cord after being immersed in another comparison fluid for 40 days (FIG. 7A), 117 days (FIG. 7B) and 419 days (FIG. 7C) respectively.

After an immersion period of 40 days, the cord was taken out and bent and did not show any signs of cracking or deterioration, though the cord did become stiffer. A photograph of the cord after bending is shown in FIG. 7A.

Figure 7B:
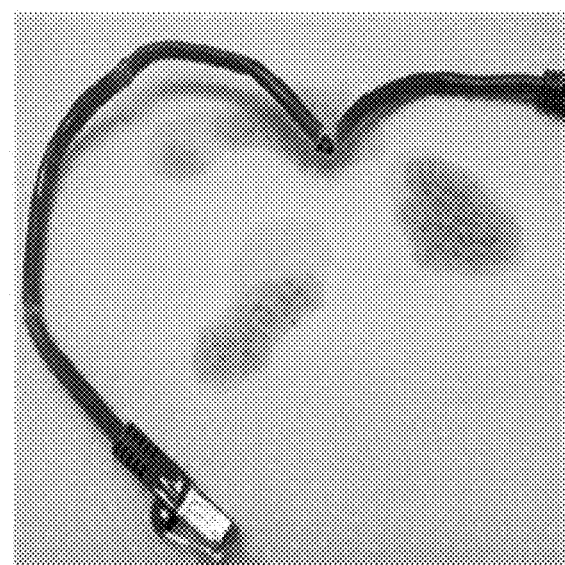
Figure 7C:
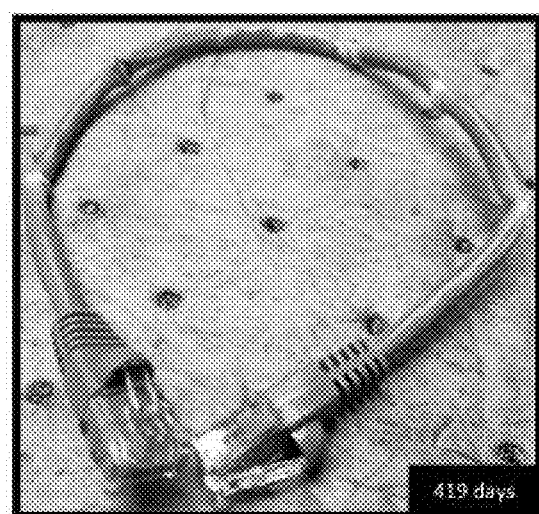

After an immersion period of 117 days, the cord was taken out and cracked when bent, as shown in FIG. 7B.

Example 2B

Each low-density polyethylene cord (PE-LD) cord was submerged in a sample cooling solution containing Chevron Neutral Oil 60R as the coolant and di(2-ethylhexyl) phthalate (DEHP) as the plasticizer at 55-60° C. for 419 days. The sample cooling solutions tested were: (A) 0.5 v/v % di(2-ethylhexyl) phthalate in Chevron Neutral Oil 60R; (B) 1.0 v/v % di(2-ethylhexyl) phthalate in Chevron Neutral Oil 60R; (C) 5.0 v/v % di(2-ethylhexyl) phthalate in Chevron Neutral Oil 60R; (D) 8.0 v/v % di(2-ethylhexyl) phthalate in Chevron Neutral Oil 60R; (E) 10.0 v/v % di(2-ethylhexyl) phthalate in Chevron Neutral Oil 60R; (F) 12.0 v/v % di(2-ethylhexyl) phthalate in Chevron Neutral Oil 60R and (G) 15.0 v/v % di(2-ethylhexyl) phthalate in Chevron Neutral Oil 60R.

Samples A, B, C, D, E, F, G were prepared by adding 2.25-mL, 4.5-mL, 22.5-mL, 36-mL, 45-mL, 54-mL, and 67.5-mL of DEHP to sufficient Chevron Neutral Oil 60R to provide a total volume of 450 mL. Each mixture was vigorously shaken until the solution appeared homogeneous.

Figure 10A:
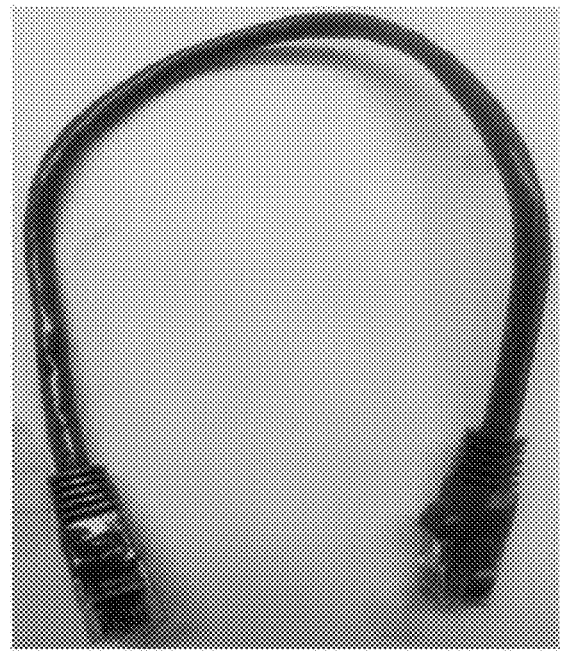
FIGS. 10A-C are photographs of a cord after being immersed in another comparison fluid for 40 days (FIG. 10A), 117 days (FIG. 10B) and 419 days (FIG. 10C) respectively.
Figure 10B:
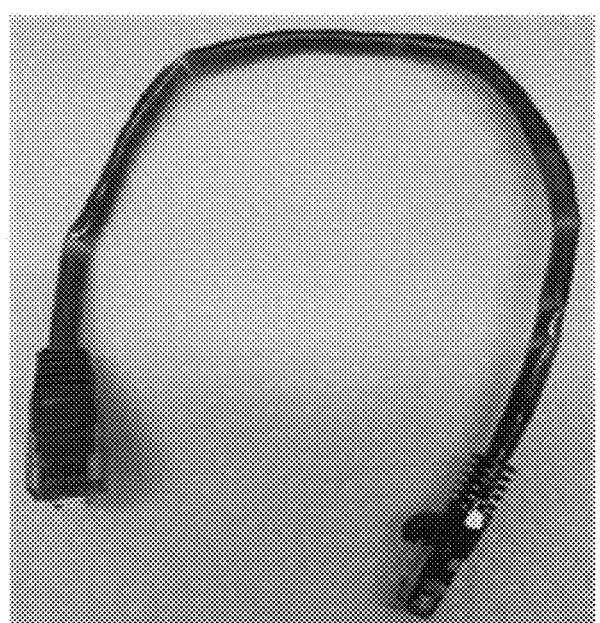
Figure 10C:
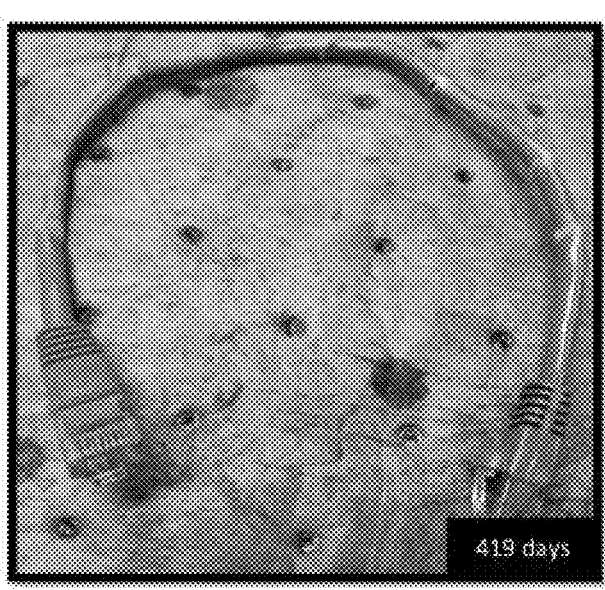
Figure 11A:
FIGS. 11A-C are photographs of a cord after being immersed in another comparison fluid for 40 days (FIG. 11A), 117 days (FIG. 11B) and 293 days (FIG. 11C) respectively.
Figure 11B:
Figure 11C:
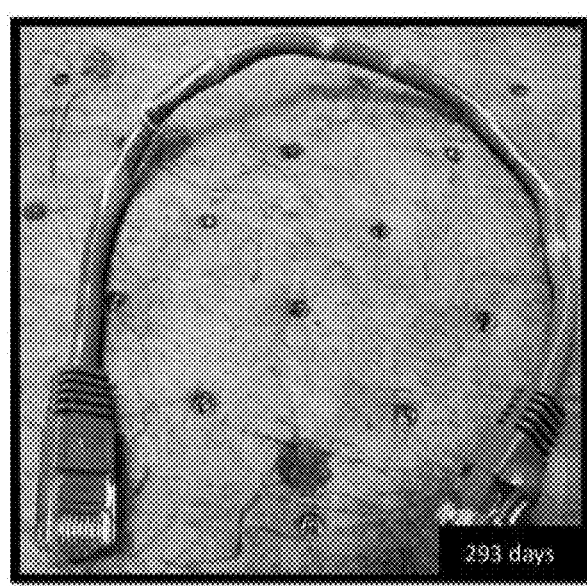

The samples were then transferred to glass jars and a test cord was submerged in each mixture before each jar was covered. Each jar was placed in a water bath between a temperature of 55-60° C. for varying periods of time. The cords were observed visually and physically examined. Photographs of the cords after immersion in Samples A, B, C, D, E, F and G for 40 days are shown in FIGS. 8A, 9A, 10A, 11A, 12A, 13A and 14A respectively. Photographs of the cords after immersion in Samples A, B, C, D, E, F and G for 117 days are shown in FIGS. 8B, 9B, 10B, 11B, 12B, 13B and 14B respectively. Photographs of the cords after immersion in Samples A, B and C for 419 days are shown in FIGS. 8C, 9C and 10C respectively. Photographs of the cords after immersion in Samples D, E, F and G for 293 days are shown in FIGS. 11C, 12C, 13C and 14C respectively. Observations of these samples and the Comparison Sample (Example 2A) are listed in Tables 2 and 3.

TABLE 2

| | Observations at Specified Loading of Plasticizer | | | |
|---|---|---|---|---|
| Time (days) | Comparison Sample (0 v/v %) | Sample A (0.5 v/v %) | Sample B (1.0 v/v %) | Sample C (5.0 v/v %) |
| 10 | A bit more difficult to bend the cord but no cracking is visible. | Cord was still easily bent. | Cord was still easily bent. | Cord was still easily bent. There was no distinct difference between 0.5-5.0% at this point. |

TABLE 2-continued

| | Observations at Specified Loading of Plasticizer | | | |
|---|---|---|---|
| Time (days) | Comparison Sample (0 v/v %) | Sample A (0.5 v/v %) | Sample B (1.0 v/v %) | Sample C (5.0 v/v %) |
| 17 | Still quite easy to bend though more difficult than before. | Cord is more easily bent than the former (the Comparison Sample). | Cord was the easiest to bend; more easily bent than the 0.5%. | Cord was still easy to bend; about the same as 1.0%. |
| 21 | A bit stiffer but not difficult to bend. | Cord was easier to bend than the Comparison Sample. | Cord was similar to that in 0.5% plasticizer. | Cord was similar to both 0.5% and 1.0%. |
| 28 | Cord was stiffer than before. | Easier to bend than the former. | Easier to bend than 0.5%. | Easier to bend than 1.0%. |
| 35 | Cord was stiffer; a lot tougher to bend. | No distinct change. | No distinct change. | Cord was still the easiest to bend. |
| 40 | Cord was moderately difficult to bend but still does not snap or crack open. Bending left slight indents and cord is quite wrinkled. | Cord was still relatively soft. It was more easily bent than the Comparison Sample and doesn't indent as bad. Cord was a bit wrinkly. | Cord was still easily bent/ bendable. Cord doesn't indent as bad as the former two after being bent. Cord was a bit wrinkly. | Cord was still the easiest to bend. Indentations are the least noticeable and cord was the least wrinkled. |
| 117 | The cord was extremely difficult to bend. After bending the cord, some of the wire had become exposed. | Cord was relatively difficult to bend though not as tough as the Comparison Sample. No rips or tears in the cord after bending. | Cord is still quite difficult to bend but there were no visible rips/tears or exposing of the wires after bending multiple times. | Cord is the least stiff and is still relatively easy to bend. No rips or tears in the cord after repeatedly bending. |
| 419 | The cord is very stiff and difficult to bend. More rips and tears visible on the cord. | The cord Is very stiff and difficult to bend. Cord ripped when being bent, thereby exposing wires. Lots of indentations after bending. | The cord is quite wrinkly and stiff yet is more easily bent than the former two. Lots of indents from bending but no visible rips or tears. | The cord is about as stiff as the 1.0%. The cord ripped/ cracked open when bending, thereby exposing wires. Lots of indents from bending |

TABLE 3

| | Observations at Specified Loading of Plasticizer | | | |
|---|---|---|---|
| Time (days) | Sample D (8.0 v/v %) | Sample E (10.0 v/v %) | Sample F (12.0 v/v %) | Sample G (15.0 v/v %) |
| 10 | Cord is very easily bent. It is very flexible, and no marks/indents were made when bending. | Cord is very easily bent. Cord is very flexible and bounces back after being bent. | Cord is very easily bent. Cord is flexible and bounces back after being bent. | Cord is very easily bent. Cord is flexible and bounces back after being bent. |
| 17 | Cord is still very flexible and easy to bend. Minimal markings made when bent (just a white discoloration, no indents made). | Cord is still very flexible and easy to bend. Minimal markings made when bent (just a white discoloration, no indents made). | Cord is still very flexible and easy to bend. Minimal markings made when bent (just a white discoloration, no indents made). | Cord is the easiest to bend and is the most flexible. The least discoloration is seen on the cord when bent. |
| 21 | Cord is still easily bent. | Cord is still easily bent. | Cord is still easily bent. | Cord is still easily bent; the most flexible of the bunch. |

TABLE 3-continued

| | Observations at Specified Loading of Plasticizer | | | |
|---|---|---|---|
| Time (days) | Sample D (8.0 v/v %) | Sample E (10.0 v/v %) | Sample F (12.0 v/v %) | Sample G (15.0 v/v %) |
| 28 | The cord is still very easily bent. | The cord is still very easily bent. | The cord is still very easily bent. Cord is a lot more flexible than 8-10%. | The cord is still very easily bent, and it is still the most flexible of the bunch. |
| 35 | The cord is starting to get a bit stiff. | No distinct change. | No distinct change. | No distinct change. |
| 40 | The cord is a bit stiff, but it is still easy to bend it. No cracking is visible after repeatedly bending. A small amount of wrinkling is visible. | The cord is a lot more flexible than 8% and is very easily bent. A small amount of wrinkling is visible on the cord. | The cord Is still very flexible, and no wrinkling of the cord can be seen. Very little indentations made after bending the cord. No cracking is seen. | The cord is not stiff at all and is still the most flexible. Cord is quite flimsy and easy to bend. No wrinkling of the cord can be seen, and the least indentation seen after bending repeatedly. |
| 117 | Cord is quite stiff and difficult to bend. No exposed wires or cracking visible after repeatedly bending. | Cord is fairly stiff and fairly difficult to bend though easier than the former. No exposed wires or cracking seen after repeated bending. | Cord is a bit stiff and a lot easier to bend than the former. Indents are seen after bending but no cracking or wires visible. | Cord is the easiest to bend and is still slightly flexible. No wires are exposed nor is cracking visible. The least indentations are seen after bending. |
| 293 | Cord is quite stiff but relatively easy to bend. There are no rips or tears after bending though there are indentations. | The cord has the same degree of flexibility as the 8.0% DEHP. There is no ripping or tearing after bending, though there are some indents where bent. | The cord Is a bit stiffer than the former, but it is still bendable. No rips or tears after bending though a lot of indentations where bent. | The cord Is the least stiff, still very easily bent and is very flexible. There are no cracks or tears after bending. Only a few minor indents seen after being bent. |

With Sample A (0.5 v/v % of DEHP added to the Chevron Neutral Oil 60R), it was observed that the cord was a bit softer and easier to bend than the Comparison Sample (FIGS. 8A-C). The cord submerged in Sample A was also less wrinkled than the Comparison Sample.

With Sample B (1.0 v/v % of DEHP added to the Chevron Neutral Oil 60R), the cord was very similar to cord submerged in Sample A. The cord had very similar flexibility to the cord submerged in Sample A, had faint indentations after being bent and was only slightly wrinkled (FIGS. 9A-C).

With Sample C (5.0 v/v % DEHP in Chevron Neutral Oil 60R), the cord did not have any indentations after bending and it was the easiest to bend when compared to the Sample A and B cords. Of samples A-C it was the most flexible after being submerged for both 40 and 177-days and was the least wrinkled. There was also no indication of cracking or snapping (FIGS. 10A-C).

Samples D and E (8.0 v/v % DEHP, FIGS. 11A-C and 10.0 v/v % DEHP Chevron Neutral Oil 60R, FIGS. 12A-C) were quite similar. With Sample D, the cord was a bit less flexible than cord in sample E entering into the second month, they both were quite stiff and quite difficult to bend when observed at both 117 days (~ 3 months) and 293 days (<10 months). However, no cracking or rips were observed.

Figure 13A:
FIGS. 13A-C are photographs of a cord after being immersed in another comparison fluid for 40 days (FIG. 13A), 117 days (FIG. 13B) and 293 days (FIG. 13C) respectively.
Figure 13B:
Figure 13C:
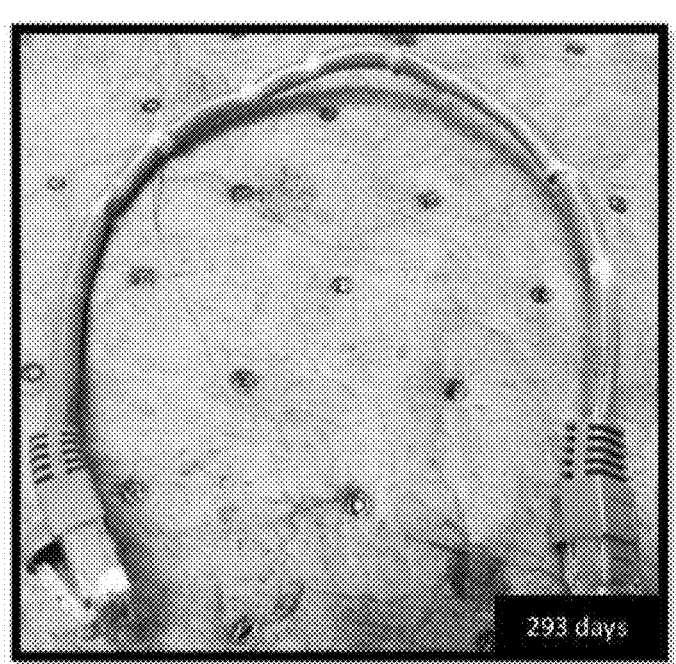
Figure 14A:
FIGS. 14A-C are photographs of a cord after being immersed in another comparison fluid for 40 days (FIG. 14A), 117 days (FIG. 14B) and 293 days (FIG. 14C) respectively.
Figure 14B:
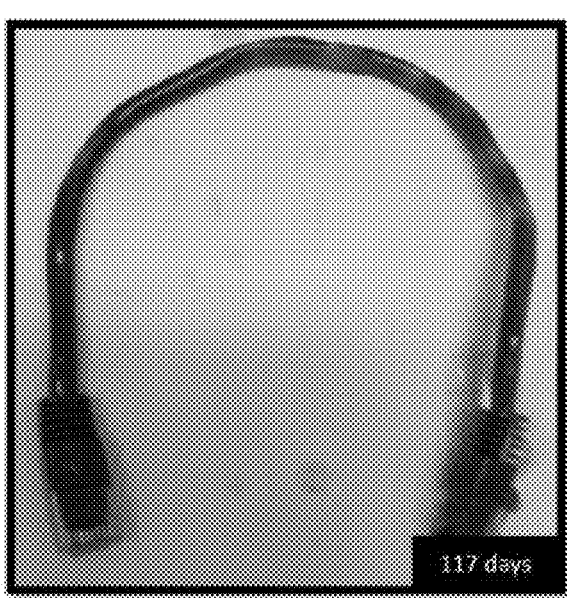
Figure 14C:
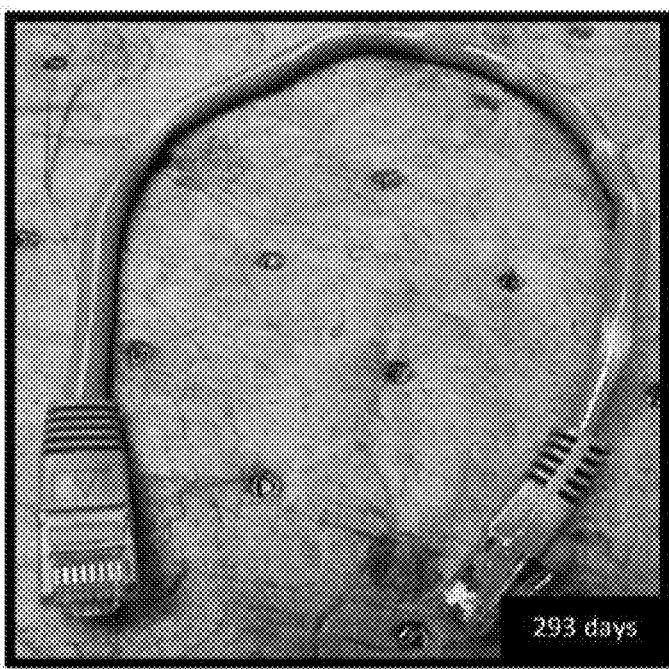

Sample G (15.0 v/v % DEHP in Chevron Neutral Oil 60R, FIGS. 14A-C) was a slight improvement from the cord submerged in Sample G (12.0 v/v % DEHP in Chevron Neutral Oil 60R, FIGS. 13A-C). The higher concentration of plasticizer allowed the cord to remain in better shape for a longer period by helping the cord remain flexible and easy to bend. Less indentations were left behind with sample G was used as opposed to the sample F. No cracking or rips were observed to date.

It was observed that, in general, deterioration of the cords lessened as a greater amount of DEHP was added to the Chevron Neutral Oil 60R.

Example 3A (Comparison)

A low-density polyethylene (PE-LD) cord was submerged in Bitcool™ at 55-60° C. for 251 days.

Figure 15B:
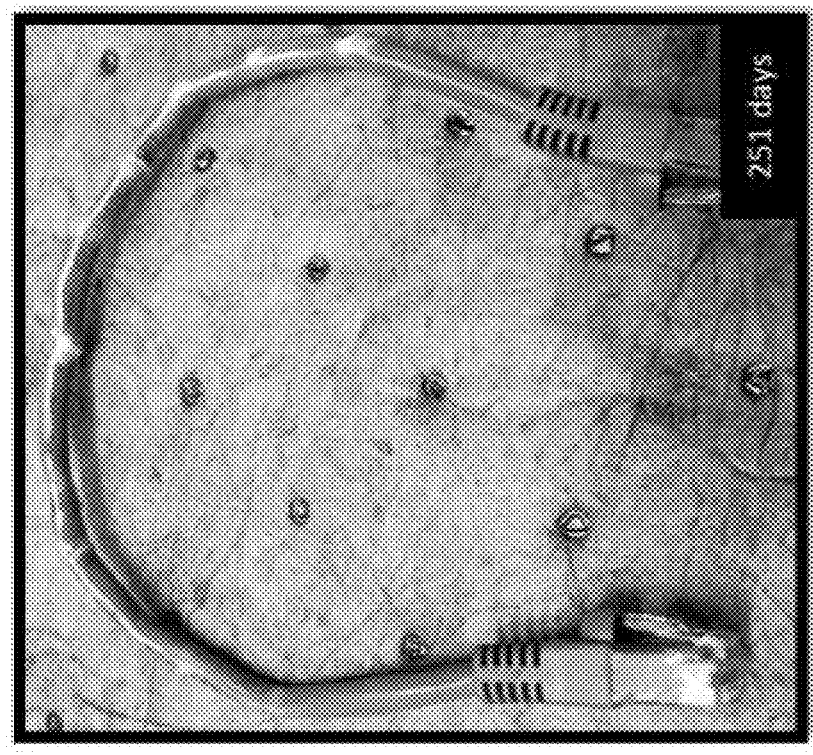
FIGS. 15A and 15B are photographs of a cord after being immersed in a cooling fluid according to an embodiment of the present disclosure for 40 days (FIG. 15A) and 251 days (FIG. 15B) respectively.
Figure 15A:
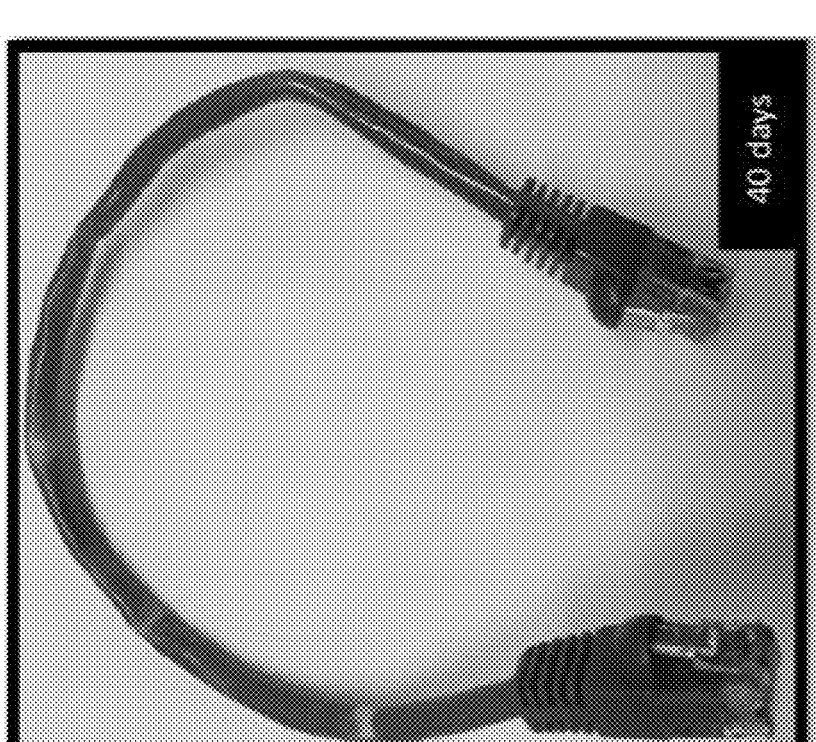

After an immersion period of 40 days, the cord was taken out and bent and the cord remained intact and did not have any cracks when continually bent (FIG. 15A. While the cord was stiff and relatively difficult to bend, it outperformed the Chevron Neutral Oil 60R (see example 2A). After 251 days, the cord was not noticeably cracked (FIG. 15B)

Example 3B

Each low-density polyethylene cord (PE-LD) cord was submerged in a sample cooling solution containing Bitcool™ as the coolant and di(2-ethylhexyl) phthalate (DEHP) as the plasticizer at 55-60° C. for 251 days. The sample cooling solutions tested were: (A) 5.0 v/v % di(2-ethylhexyl) phthalate in Bitcool™; (B) 10.0 v/v % di(2-ethylhexyl) phthalate in Bitcool™ and (C) 15.0 v/v % di(2-ethylhexyl) phthalate in Bitcool™.

Samples A, B, C were prepared by adding 22.5-mL, 45-mL, and 67.5-mL respectively of DEHP to sufficient Bitcool™ to provide a total volume of 450 mL. Each mixture was vigorously shaken until the solution appeared homogeneous.

Figure 16B:
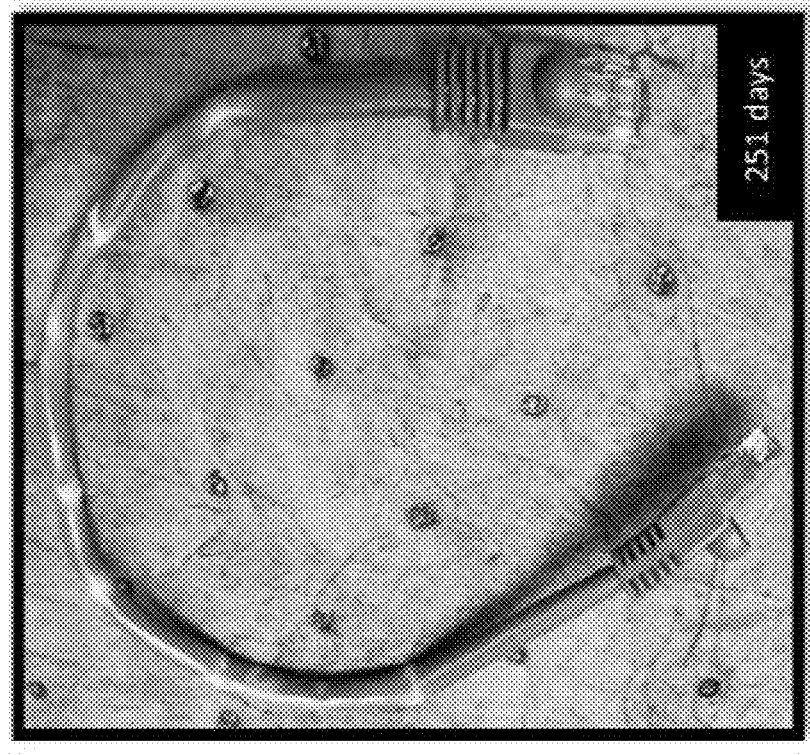
FIGS. 16A and 16B are photographs of a cord after being immersed in a cooling fluid according to an embodiment of the present disclosure for 40 days (FIG. 16A) and 251 days (FIG. 16B) respectively.
Figure 16A:
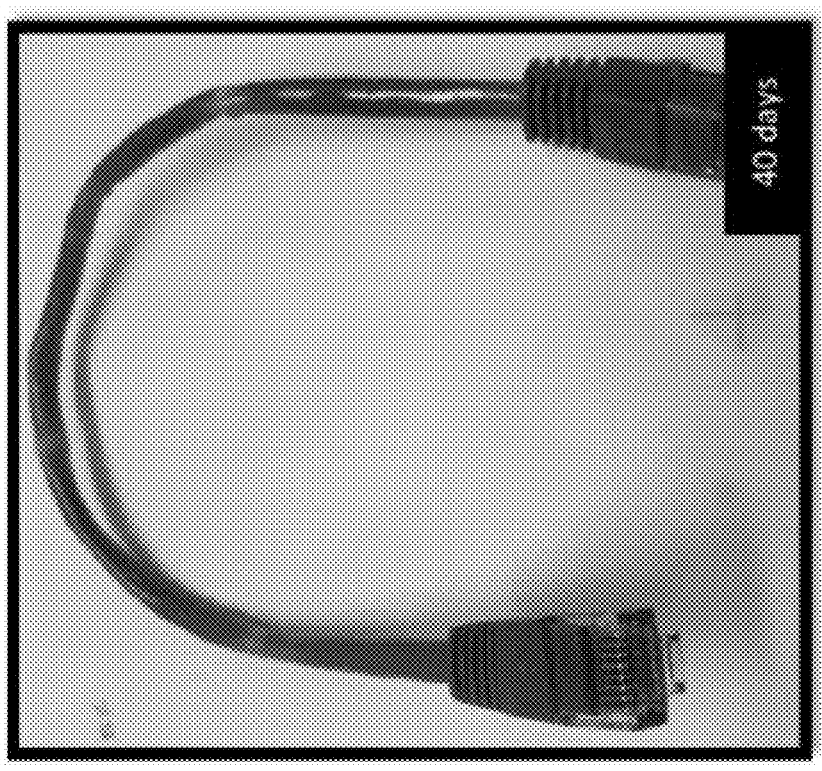
Figure 17B:
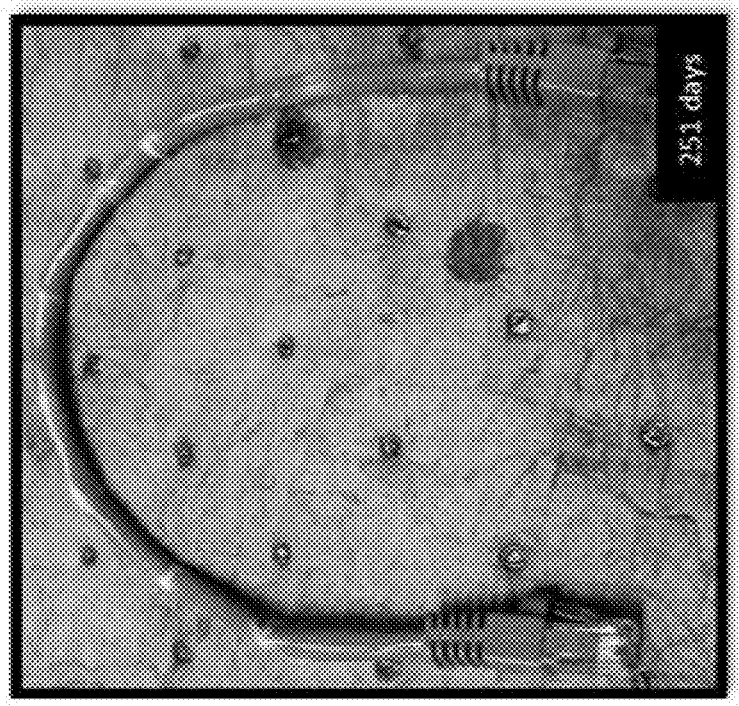
FIGS. 17A and 17B are photographs of a cord after being immersed in a cooling fluid according to an embodiment of the present disclosure for 40 days (FIG. 17A) and 251 days (FIG. 17B) respectively.
Figure 17A:
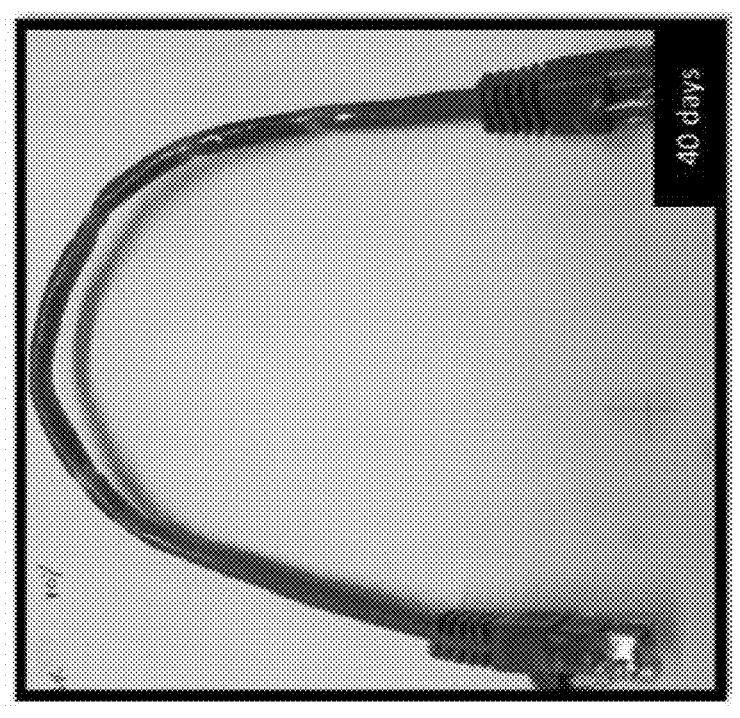
Figure 18B:
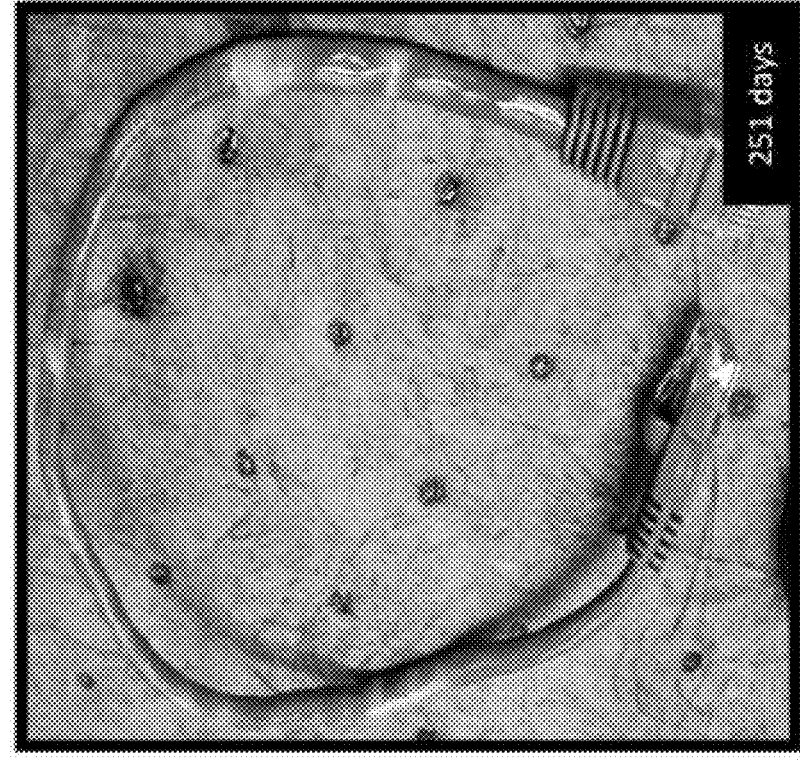
FIGS. 18A and 18B are photographs of a cord after being immersed in a cooling fluid according to an embodiment of the present disclosure for 40 days (FIG. 18A) and 251 days (FIG. 18B) respectively.
Figure 18A:
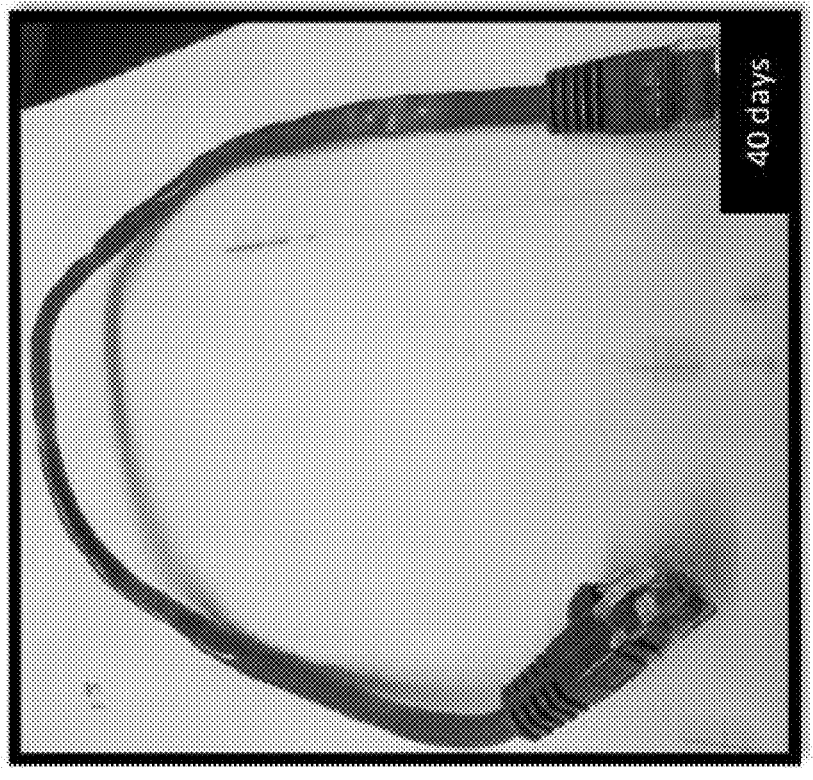

The samples were then transferred to glass jars and a test cord was submerged in each mixture before each jar was covered. Each jar was placed in a water bath between a temperature of 55-60° C. The cords were observed visually and physically examined. Photographs of the cords after immersion in Samples A, B, C, for 40 days are shown in FIGS. 16A, 17A and 18A respectively. Photographs of the cords after immersion in Samples A, B and C for 251 days are shown in FIGS. 16B, 17B and 18B respectively. Observations of these samples and the Comparison Sample (Example 3A) are listed in Table 4.

TABLE 4

| | Observations at Specified Loading of Plasticizer | | | |
|---|---|---|---|---|
| Time (days) | Comparison Sample (0 v/v %) | Sample A (5.0 v/v %) | Sample B (10.0 v/v %) | Sample C (15.0 v/v %) |
| 10 | Cord is still very flexible and easily bent. No marks or indents made when bending. | Cord is still very flexible and easily bent. No marks or indents made when bending. | Cord is still very flexible and easily bent. No marks or indents made when bending. | Cord is still very flexible and easily bent. No marks or indents made when bending. Cord is the most flexible. |
| 17 | Cord is still very flexible. Bending does not leave a lasting impression/indent. | Cord is more easily bent than the former (the Comparison Sample). | Cord is quite a bit more flexible than the blank. | Cord is extremely flexible. No indents are made at all upon bending repeatedly. |
| 21 | Cord is getting a bit stiff and is harder to bend than before. Faint white marks left after bending the cord. | Cord is still relatively easy to bend. Some faint white marks are visible after bending the cord. | Cord is still very flexible. No white marks left after bending the cord repeatedly. | Cord is the most flexible but appears less puffy than the other cords. No indents or marks made after bending. |
| 28 | Cord is stiffer and starting to get wrinkled. | Cord is still easily bent and there is no wrinkling of the cord. | Cord is still easily bent and there is no wrinkling of the cord. | Cord is still easily bent and there is no wrinkling of the cord. |
| 35 | Cord is even tougher to bend, and distinct marks are left after bending. | Cord is a lot easier to bend than the former (blank). Some distinct marks left when bent. | Cord is slightly easier to bend than the former (5%). Some distinct marks left when bent. | Cord is still the easiest to bend. No indents/marks made when bent. Cord looks elongated. |
| 40 | Cord is very stiff and tough to bend but there is no cracking or tears. Lots of marks seen, however, from bending the cord. | Cord is fairly stiff, but it is much easier to bend than the blank. No cracking or tears are visible, though white markings where bent are. | Cord is quite a bit easier to bend than the former (5%). No cracks or rips are visible, though some markings are. | Cord appears elongated and skinnier. It is still the easiest to bend and there are no visible rips or cracks. |

TABLE 4-continued

| | Observations at Specified Loading of Plasticizer | | | |
|---|---|---|---|---|
| Time (days) | Comparison Sample (0 v/v %) | Sample A (5.0 v/v %) | Sample B (10.0 v/v %) | Sample C (15.0 v/v %) |
| 251 | Cord is extremely stiff and difficult to bend. However, no cracking or tears are present. Only more indents are visible where bent. | Cord is a lot easier to bend than the blank but is still quite stiff. No rips or tears present after bending, but lots of indentations seen. | Cord is quite stiff but more easily bent than the former two. No rips or tears present but big indents seen where previously bent. | Cord is still very flexible and easy to bend. The easiest to bend of the bunch. Only minor indents visible, no cracking or rips present. |

With Samples A and B (5.0 v/v % of DEHP and 10.0 v/v % respectively added to the Bitcool™), the cord was slightly easier to bend with the higher loading being a bit easier. No snapping or cracks were visible after continuous bending (FIGS. 16A-B and 17A-B) with either Sample A or B.

With Sample C (15.0 v/v % of DEHP added to the Bitcool™), in looking at the cord submerged in Bitcool with 15.0% DEHP, it is evident that the cord is much better maintained in comparison to samples A and B. With sample C, the is still very flexible, only has minor indentations from being bent and is still easy to bend after being submerged for 251 days. No cracks or rips to the cord are present (FIG. 18B).

Example 4A (Comparison)

A low-density polyethylene (PE-LD) cord was submerged in Conosol 340 at 55-60° C. for 169 days.

Figures 19A, 19B:
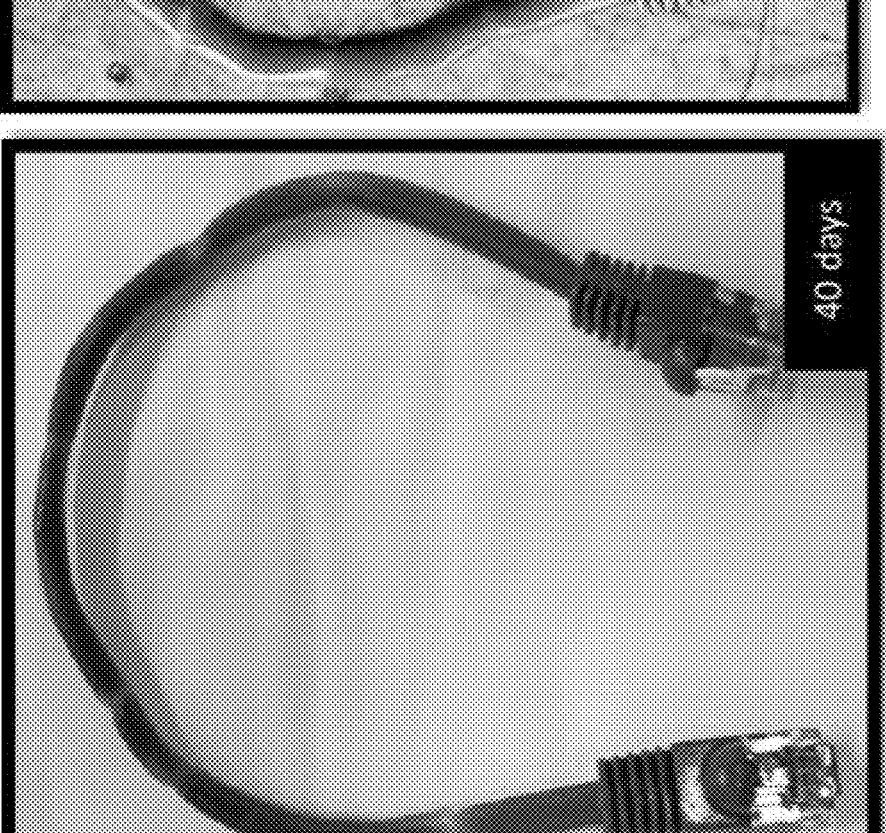
FIGS. 19A and 19B are photographs of a cord after being immersed in a cooling fluid according to an embodiment of the present disclosure for 40 days (FIG. 19A) and 169 days (FIG. 19B) respectively.

After an immersion period of 40 days, the cord was taken out and bent and the cord remained intact and did not have any cracks when continually bent (FIG. 19A). It also outperformed the Chevron Neutral Oil 60R (see example 2A). After 169 days, the cord was not noticeably cracked (FIG. 19B)

Example 4B

Each low-density polyethylene cord (PE-LD) cord was submerged in a sample cooling solution containing Conosol 340 as the coolant and di(2-ethylhexyl) phthalate (DEHP) as the plasticizer at 55-60° C. for 169 days. The sample cooling solutions tested were: (A) 5.0 v/v % di(2-ethylhexyl) phthalate in Conosol 340; (B) 10.0 v/v % di(2-ethylhexyl) phthalate in Conosol 340 and (C) 15.0 v/v % di(2-ethylhexyl) phthalate in Conosol 340.

Samples A, B, C were prepared by adding 22.5-mL, 45-mL, and 67.5-mL respectively of DEHP to sufficient Conosol 340 to provide a total volume of 450 mL. Each mixture was vigorously shaken until the solution appeared homogeneous.

Figure 20B:
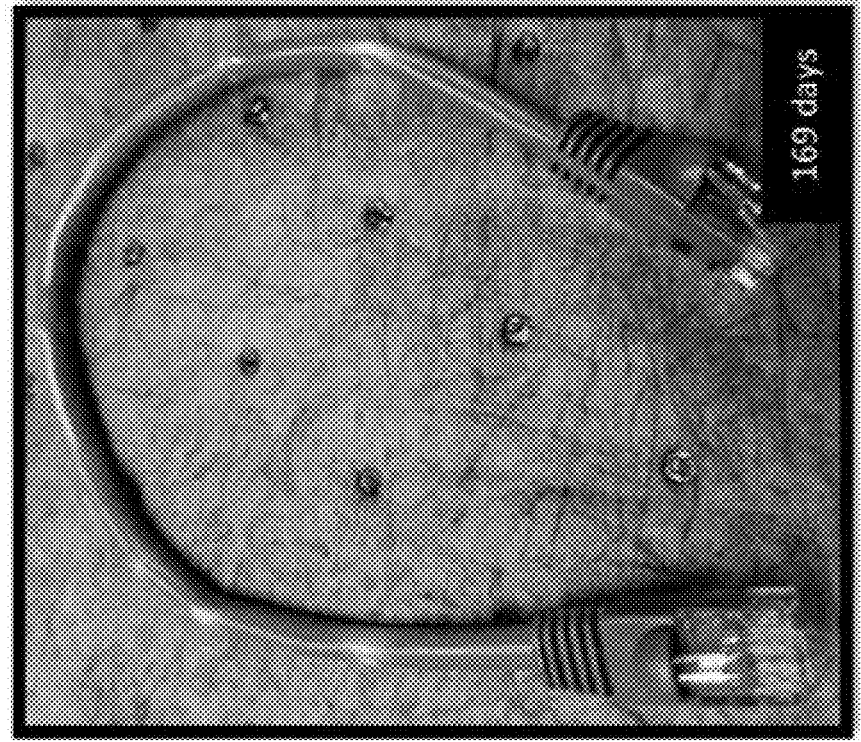
FIGS. 20A and 20B are photographs of a cord after being immersed in a cooling fluid according to an embodiment of the present disclosure for 40 days (FIG. 20A) and 169 days (FIG. 20B) respectively.
Figure 20A:
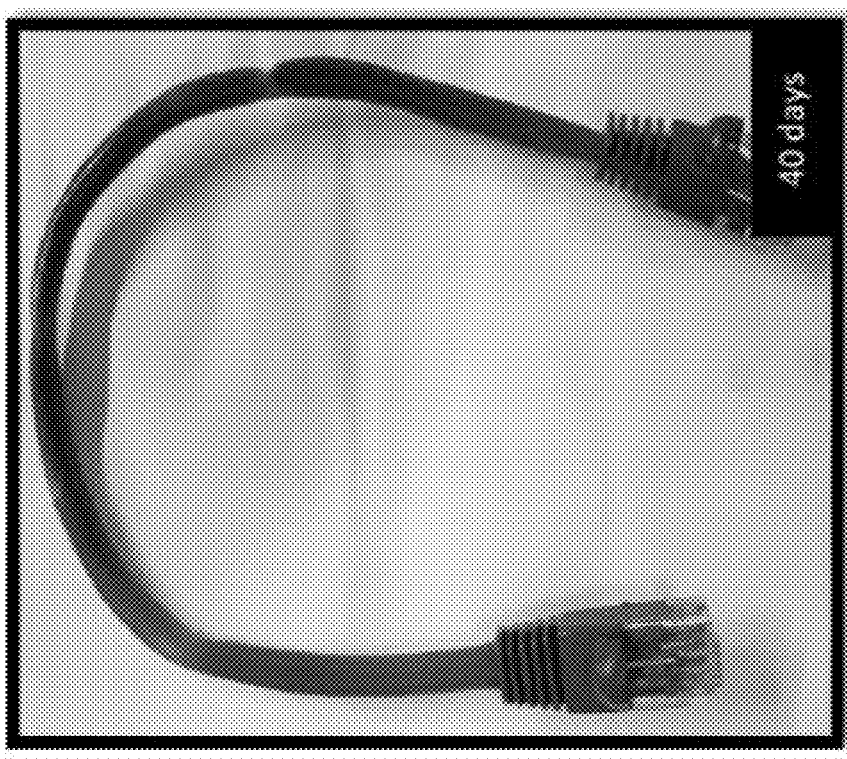
Figure 21B:
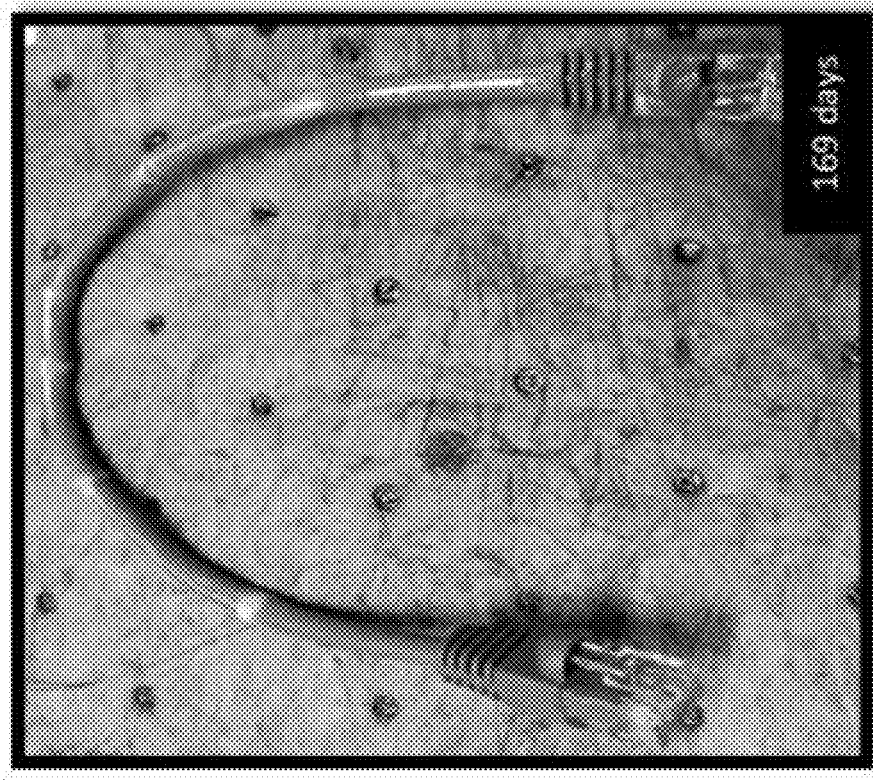
FIGS. 21A and 21B are photographs of a cord after being immersed in a cooling fluid according to an embodiment of the present disclosure for 40 days (FIG. 21A) and 169 days (FIG. 21B) respectively.
Figure 21A:
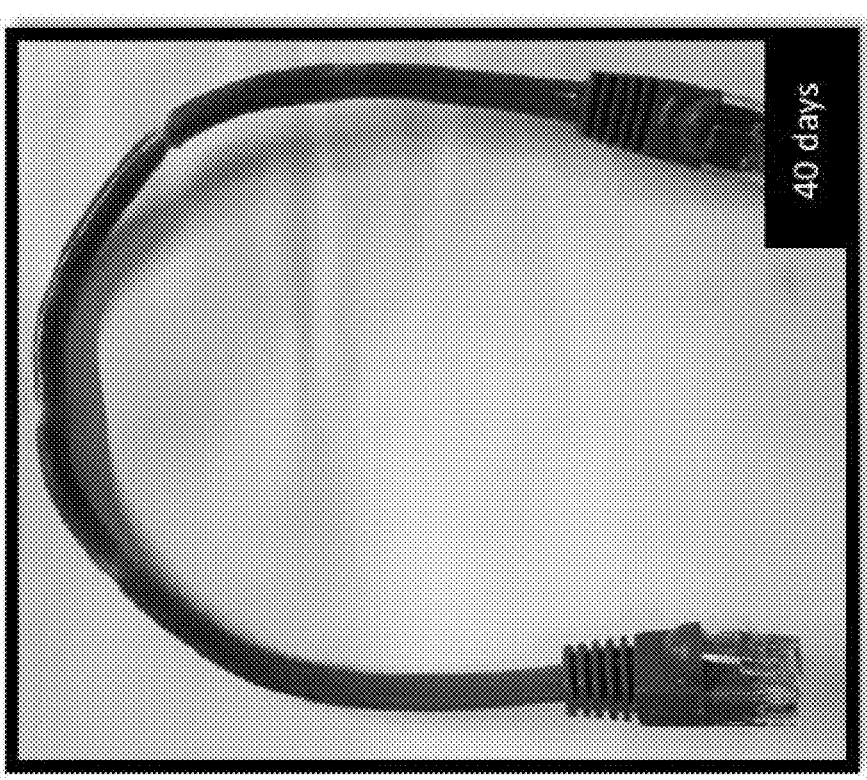
Figure 22B:
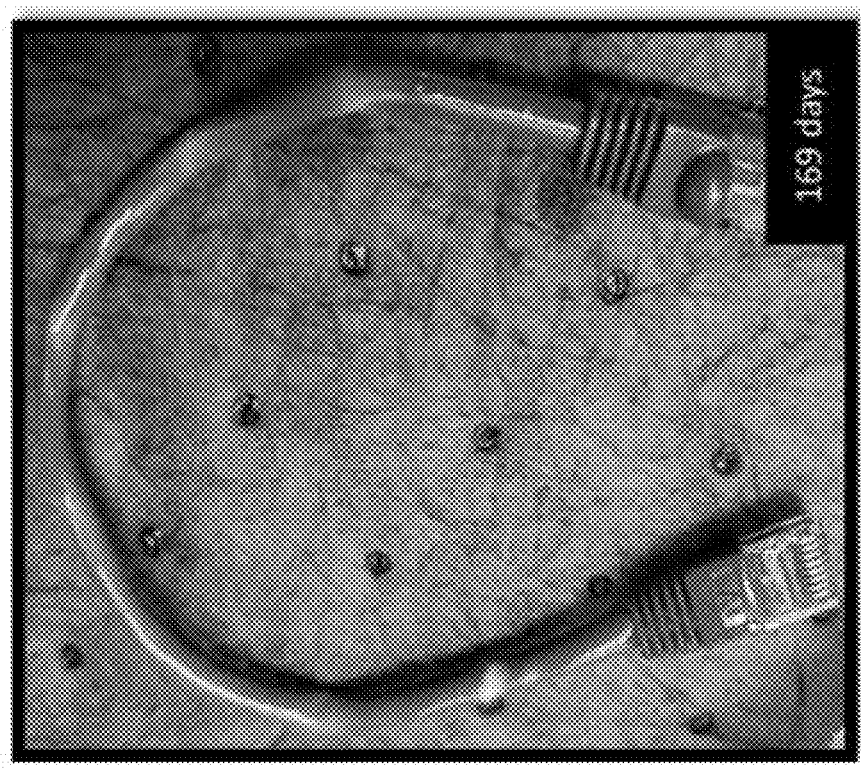
FIGS. 22A and 22B are photographs of a cord after being immersed in a cooling fluid according to an embodiment of the present disclosure for 40 days (FIG. 22A) and 169 days (FIG. 22B) respectively.
Figure 22A:
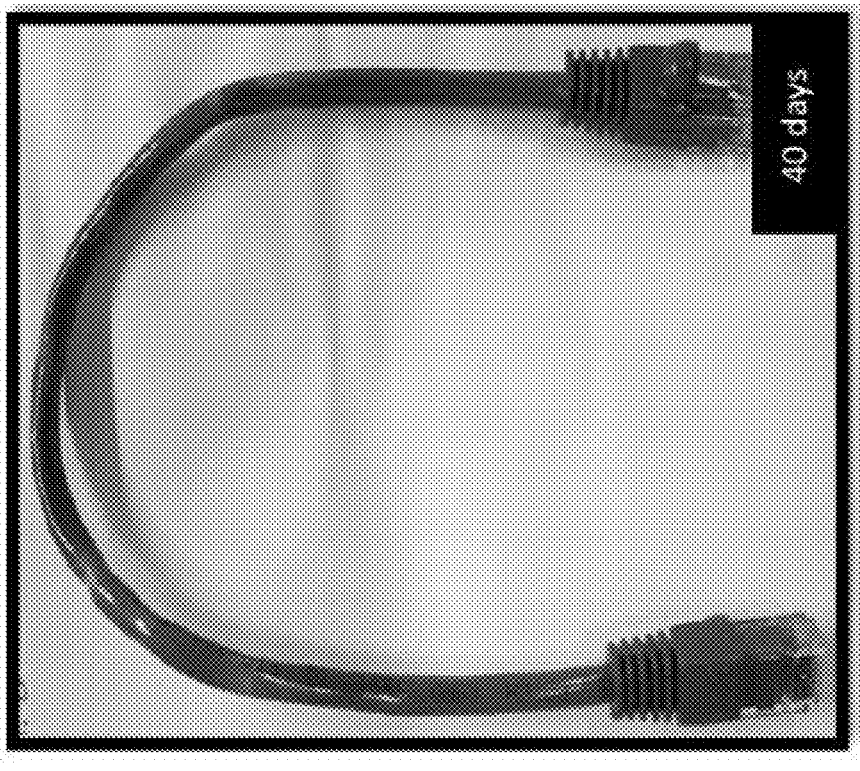

The samples were then transferred to glass jars and a test cord was submerged in each mixture before each jar was covered. Each jar was placed in a water bath between a temperature of 55-60° C. The cords were observed visually and physically examined. Photographs of the cords after immersion in Samples A, B, C, for 40 days are shown in FIGS. 20A, 21A and 22A respectively. Photographs of the cords after immersion in Samples A, B and C for 169 days are shown in FIGS. 20B, 21B and 22B respectively. Observations of these samples and the Comparison Sample (Example 4A) are listed in Table 5.

TABLE 5

| | Observations at Specified Loading of Plasticizer | | | |
|---|---|---|---|---|
| Time (days) | Comparison Sample (0 v/v %) | Sample A (5.0 v/v %) | Sample B (10.0 v/v %) | Sample C (15.0 v/v %) |
| 10 | Cord is still very flexible and easy to bend. No marks or indents made when bending. | Cord is flexible and easier to bend than the blank. No marks or indents made when bending. | Cord is flexible and easier to bend than the former (5%). No marks/indents made when bending. | Cord is extremely flexible and easily bent. No marks or indents made when bending. |
| 17 | Cord is a bit stiffer but not difficult to bend. No indents or marks made. | Cord is still very flexible and is a lot easier to bend than the blank. | Cord is very flexible and more so than the 5%. Easier to bend than the former. | Cord is very flexible and the most flexible of the bunch. A lot easier to bend than the former. |
| 21 | Cord is slightly stiffer but still easily bent. One slight indent seen after bending cord. | Cord is very flexible and very easily bent. No indents or marks made when bending. | Cord is very flexible and a lot easier to bend than the former two. No indents/ marks seen. | Cord is the most flexible and is the easiest to bend. No indents/ marks seen after bending. |

TABLE 5-continued

| | Observations at Specified Loading of Plasticizer | | | |
| --- | --- | --- | --- | --- |
| Time (days) | Comparison Sample (0 v/v %) | Sample A (5.0 v/v %) | Sample B (10.0 v/v %) | Sample C (15.0 v/v %) |
| 28 | Cord is still very flexible and easily bend. Slight indentations seen after bending. | A lot more flexible than the blank. A white mark seen but no indentations made after bending. | Cord is more easily bent than the 5%. The cord looks bloated or puffy. No indentations seen. | Cord is still the most flexible. A lot more easily bent than the 5/10%. No indentations or marks. |
| 35 | Cord is a lot stiffer and a bit harder to bend. More prominent indents seen after bending. | Cord is a lot more flexible than the blank. Faint impressions made on cord after bending. | Cord is more flexible and easily bent than the 5%. No indents or impressions made/seen. | Cord is still extremely easy to bend. No indents or impressions made after bending cord. |
| 40 | Cord is very stiff and difficult to bend. Lots of indents made after bending but no cracking or rips seen. | Cord is more flexible than the blank but is very stiff. Cord is relatively difficult to bend, and some indents made. | Cord is very stiff and difficult to bend. Prominent indents made after bending but still no cracking or rips. | Cord is the easiest to bend and is the most flexible. No prominent indents/marks made after bending. |
| 169 | Cord is quite stiff but relatively easy to bend. No rips or tears after being bent, though some indentations seen. | Cord is stiffer than the blank but is still relatively easy to bend. Less indentations than the former and still no cracks or rips seen. | Cord is stiffer than the former and is difficult to bend. No cracking or rips after bending, though lots of indentation seen. | Cord is a bit stiff but still easily bent. No cracks or rips seen, though some slight marks visible. No indents after being bent. |

With Samples A and B (5.0 v/v % of DEHP and 10.0 v/v % respectively added to the Conosol 340), the cord was slightly easier to bend with the higher loading being a bit easier. No snapping or cracks were visible after continuous bending (FIGS. 20A-B and 21A-B) with either Sample A or B.

With Sample C (15.0 v/v % of DEHP added to the Conosol 340), in looking at the cord submerged in Conosol 340 with 15.0% DEHP, it is evident that the cord is much better maintained in comparison to samples A and B. With sample C, the cord does not have any indentations from being bent and is still easy to bend after being submerged for 169 days. No cracks or rips to the cord are present (FIG. 22B).

Example 5A (Comparison)

Figure 23B:
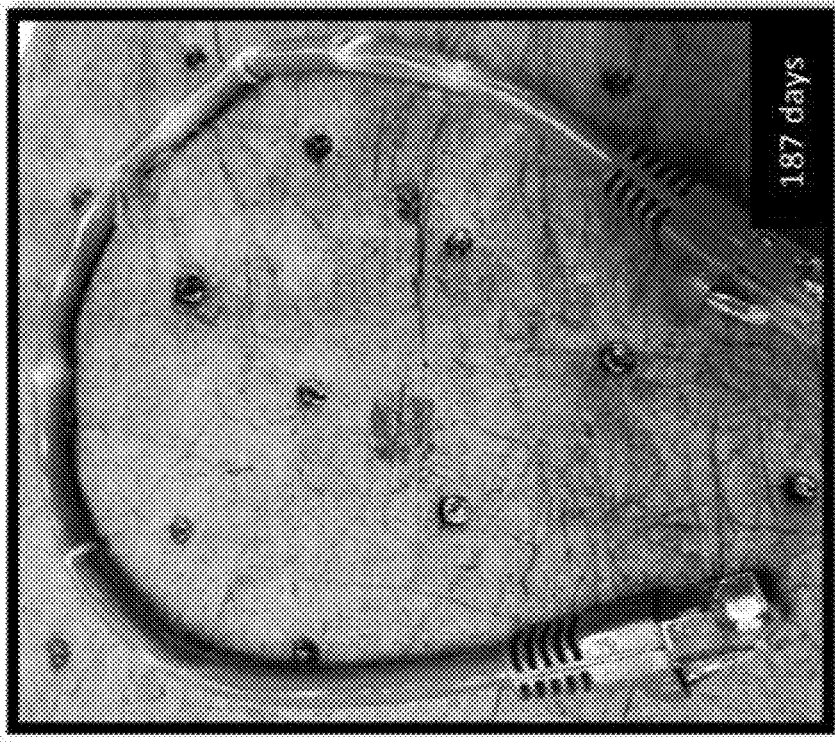
FIGS. 23A and 23B are photographs of a cord after being immersed in a cooling fluid according to an embodiment of the present disclosure for 40 days (FIG. 23A) and 187 days (FIG. 23B) respectively.
Figure 23A:
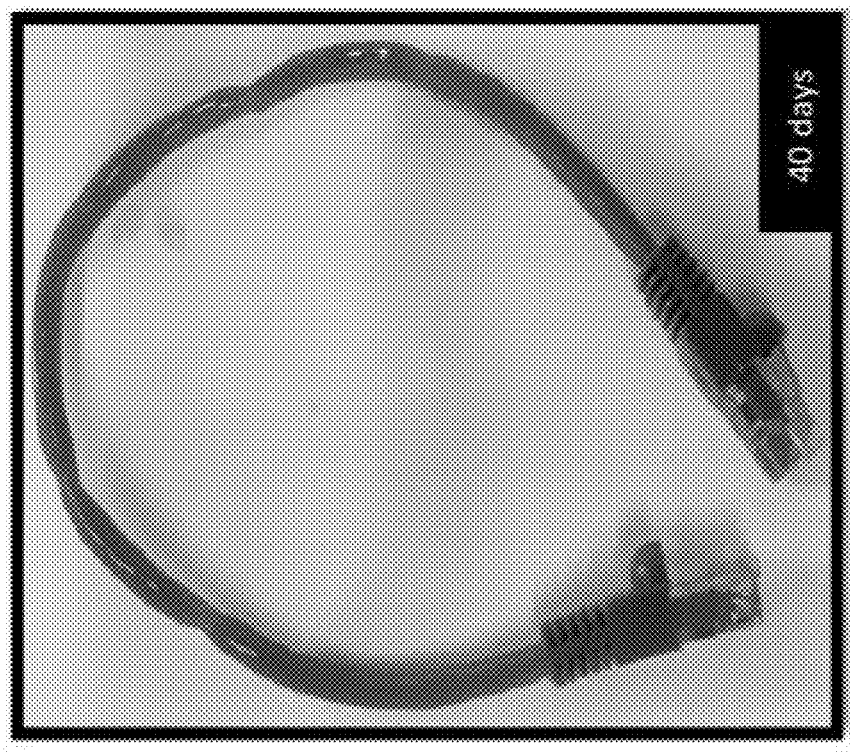

A low-density polyethylene (PE-LD) cord was submerged in Chevron Neutral Oil 60R at 55-60° C. for 187 days. The cord after 40 days can be seen in FIG. 23A and the cord after 187 days can be seen in FIG. 23B.

Example 5B

Each low-density polyethylene cord (PE-LD) cord was submerged in a sample cooling solution containing Chevron Neutral Oil 60R as the coolant and Hexamoll Dinch (1,2-Cyclohexane dicarboxylic acid, diisononyl ester) as the plasticizer at 55-60° C. for 169 days. The sample cooling solutions tested were: (A) 5.0 v/v % Hexamoll Dinch in Chevron Neutral Oil 60R; (B) 10.0 v/v % Hexamoll Dinch in Chevron Neutral Oil 60R and (C) 15.0 v/v % Hexamoll Dinch in Chevron Neutral Oil 60R.

Samples A, B, C were prepared by adding 22.5-mL, 45-mL, and 67.5-mL respectively of Hexamoll Dinch to sufficient Chevron Neutral Oil 60R to provide a total volume of 450 mL. Each mixture was vigorously shaken until the solution appeared homogeneous.

Figure 24B:
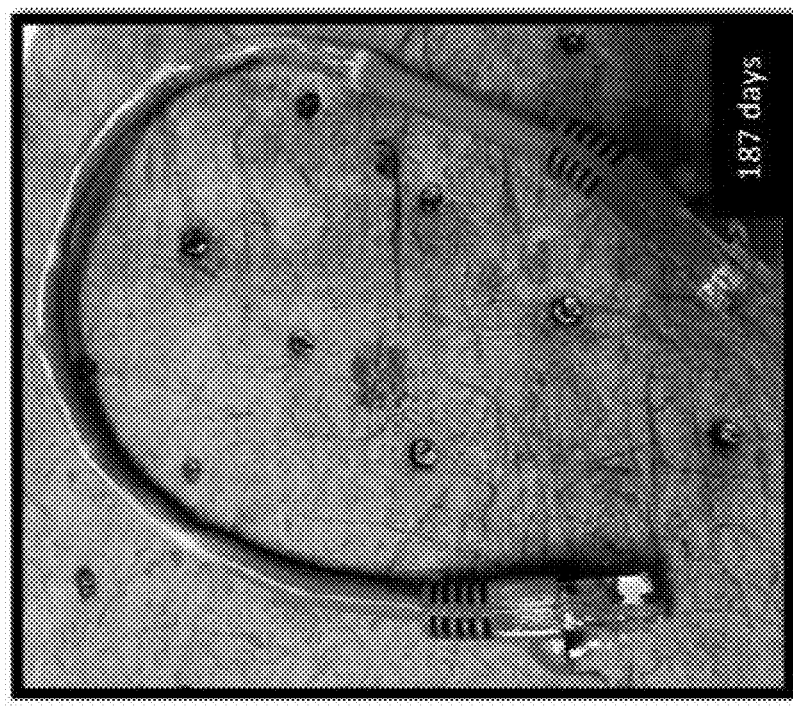
FIGS. 24A and 24B are photographs of a cord after being immersed in a cooling fluid according to an embodiment of the present disclosure for 40 days (FIG. 24A) and 187 days (FIG. 24B) respectively.
Figure 24A:
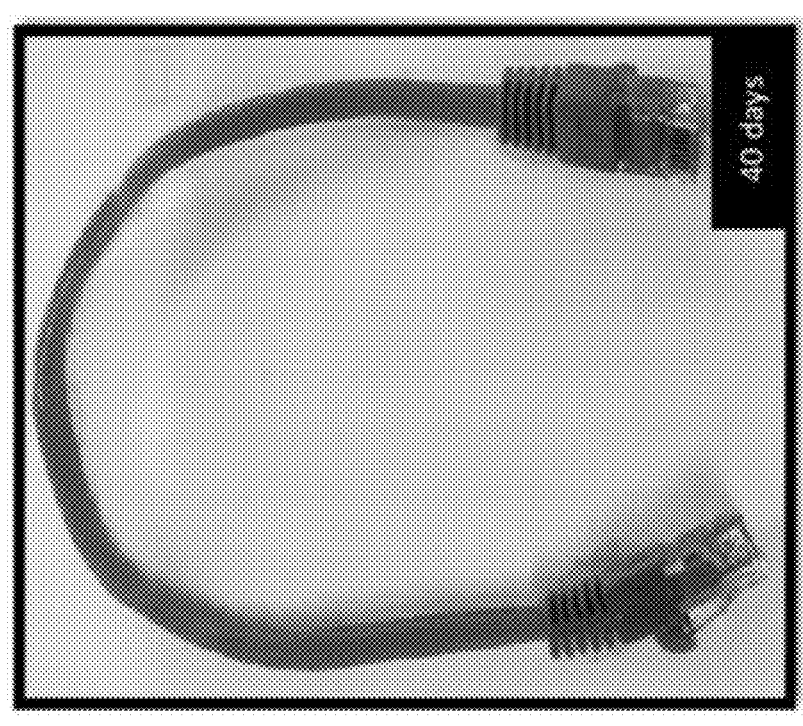
Figure 25A:
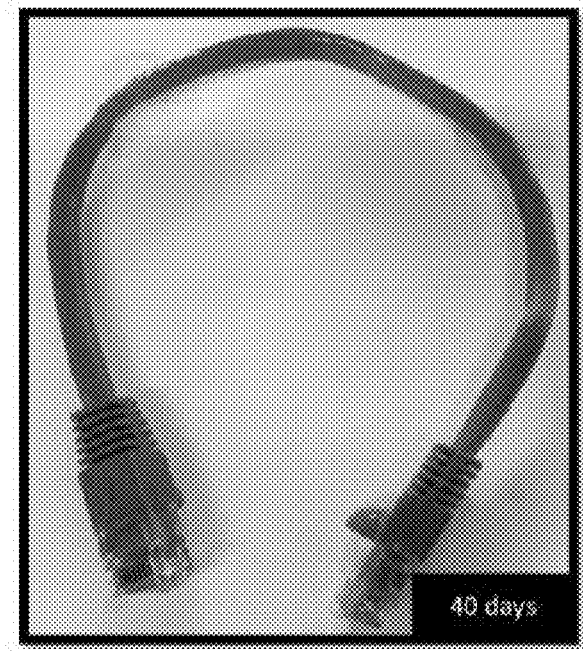
FIGS. 25A-C are photographs of a cord after being immersed in a cooling fluid according to an embodiment of the present disclosure for 40 days (FIG. 25A) and 187 days (FIGS. 25B and 25C) respectively.
Figure 25B:
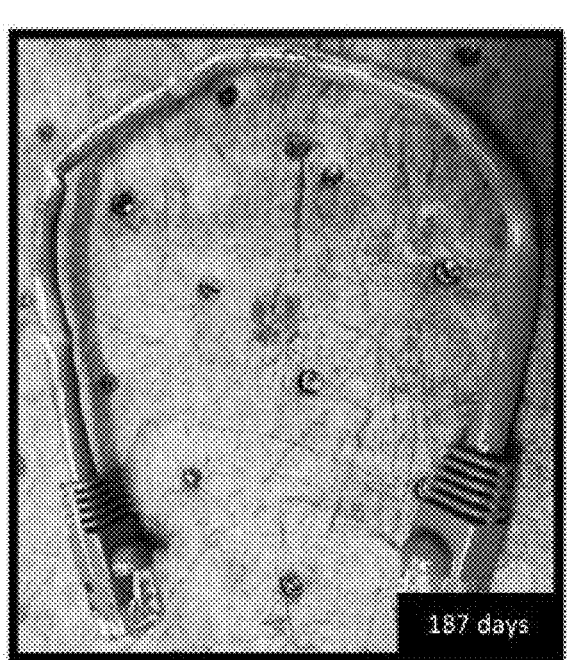
Figure 25C:
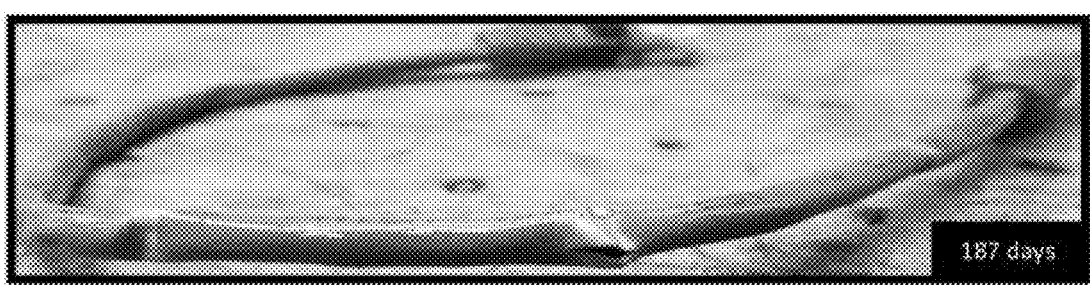
Figure 26B:
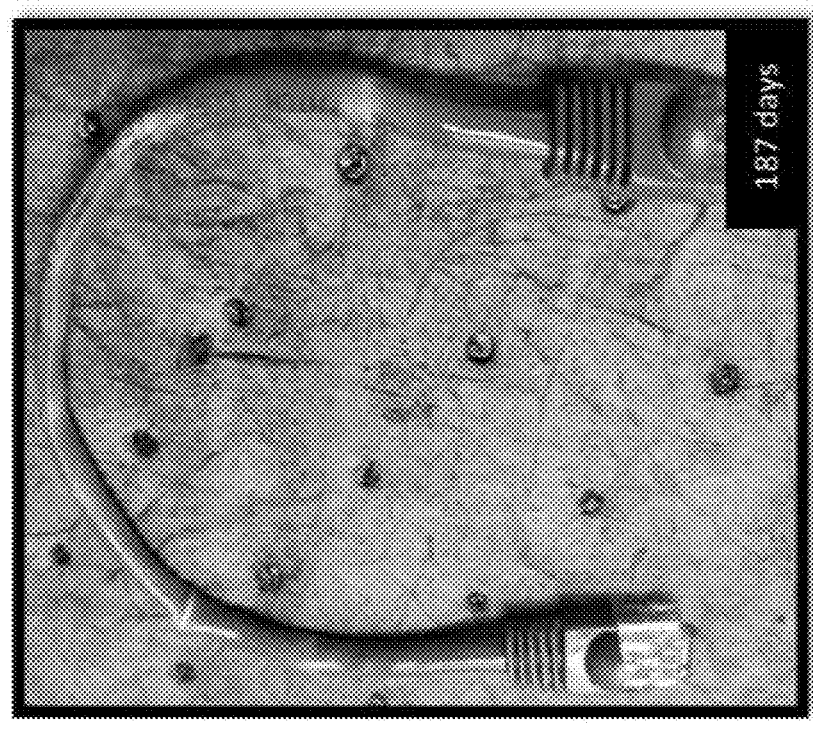
FIGS. 26A and 26B are photographs of a cord after being immersed in a cooling fluid according to an embodiment of the present disclosure for 40 days (FIG. 26A) and 187 days (FIG. 26B) respectively.
Figure 26A:
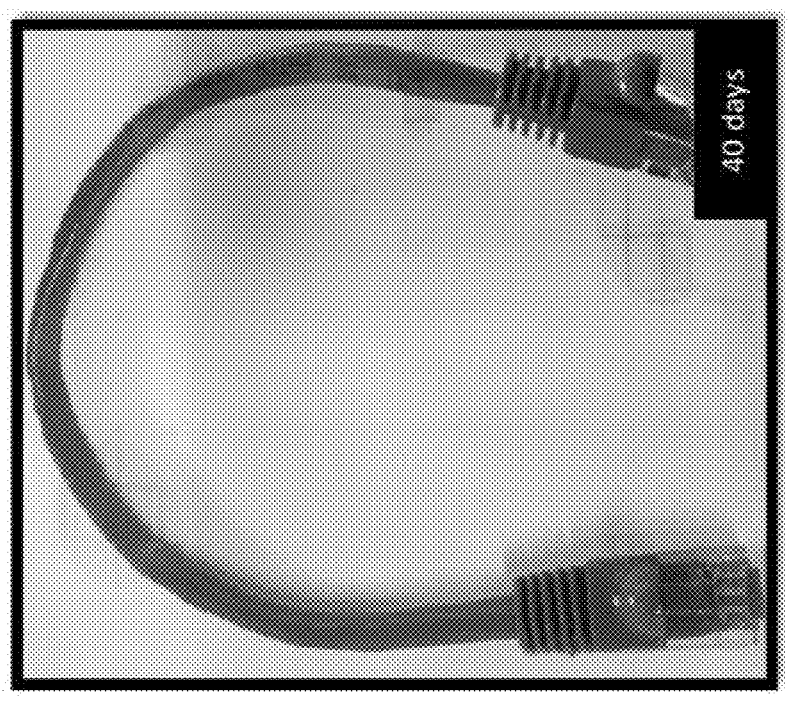

The samples were then transferred to glass jars and a test cord was submerged in each mixture before each jar was covered. Each jar was placed in a water bath between a temperature of 55-60° C. The cords were observed visually and physically examined. Photographs of the cords after immersion in Samples A, B, C, for 40 days are shown in FIGS. 24A, 25A and 26A respectively. Photographs of the cords after immersion in Samples A, B and C for 187 days are shown in FIGS. 24B, 25B-C and 26B respectively. Observations of these samples and the Comparison Sample (Example 5A) are listed in Table 6.

TABLE 6

| Time (days) | Comparison Sample (0 v/v %) | Sample A (5.0 v/v %) | Sample B (10.0 v/v %) | Sample C (15.0 v/v %) |
|---|---|---|---|---|
| | Observations at Specified Loading of Plasticizer | | | |
| 10 | Cord is still very flexible and easy to bend. No marks or indents made when bending. | Cord is still very flexible and easy to bend. Easier to bend than the former. No marks/ indents. | Cord is still very flexible and easy to bend. Easier to bend than the former. No marks/ indents. | Cord is the most flexible and the easiest to bend. Cord looks the thickest. No marks/indents |
| 17 | Cord is still relatively easy to bend. Minor indentations seen after bending. | Cord is more easily bent than the former. Minor indentations seen after bending cord. | Cord is more easily bent than the former. No marks or indentations seen after bending cord. | Cord is the easiest to bend of the bunch. No marks or indentations seen after bending cord. |
| 21 | Cord is a bit more difficult to bend. Some more indentations seen after bending. | Cord is still easily bent. Only minor indentations seen after bending cord. | Cord is still easily bent and easier to bend than the 5%. No indents/ marks when bent. | Cord is still easily bent and is the easiest to bend. No indents/marks when bent. |
| 28 | Cord is a bit stiffer and more difficult to bend. More indents seen after bending cord. | Cord is a bit stiffer, but a lot more easily bend than the blank. More indents seen after bending cord. | Cord is a bit stiffer but a bit easier to bend than the 5%. Slight indentation seen after bending. | Cord is still the easiest to bend and the most flexible. No indents seen after bending. |
| 35 | Cord is more difficult to bend. A lot of indents after being but no cracking or rips seen. | Cord is a bit stiffer and harder to bend though a lot easier than the blank. Slight indentation after bending. | Cord is a lot easier to bend than the former and is still quite flexible. Slight indentation after bending. | Cord is still quite flexible and easy to bend. A lot easier to bend than the former. The least indentation seen after bending. |
| 40 | Cord is very stiff and much more difficult to bend. More indents and marks after bending but no cracking or rips seen. | Cord is a lot easier to bend than the blank. Minimal indents seen and it is still quite flexible. Cord looks thicker than the blank. | Cord is a lot stiffer than the 5% and is quite difficult to bend. Quite deep indentations seen after bending the cord. | Cord is easier to bend than the 10%. Some deep indentations/ marks seen after bending the cord. |
| 187 | Cord is fairly stiff and a bit difficult to bend. More indents and marks seen but no cracking or tears. | Cord is a bit stiff but a lot less stiff than the blank. It is quite easy to bend. No tears or cracks, just minimal indents. | Cord is stiffer than the 5%. Relatively difficult to bend and the cord cracked when bent and exposed some wires. | Cord is quite stiff but much more flexible than the former. Cord is easily bend with some indents but no cracks. |

After about 40 days, the cord immersed in Sample B (10.0 v/v % of Hexamoll Dinch added to the Chevron Neutral Oil 60R) appeared to make the cord stiffer than the cord immersed in Sample A (5.0 v/v % of Hexamoll Dinch added to the Chevron Neutral Oil 60R) although the cord immersed in Sample C (15.0 v/v % of Hexamoll Dinch added to the Chevron Neutral Oil 60R appeared to make the cord more flexible than Samples A of B. At approximately 6 months, there was noticeable cracking on the cord submerged in Sample B. No noticeable cracking had been seen on the submerged cord using 10% DEHP in the same oil—Chevron Neutral Oil 60R—even after nearly ten months of being submerged in fluid (see example 2B).

Example 6A (Comparison)

Figure 27B:
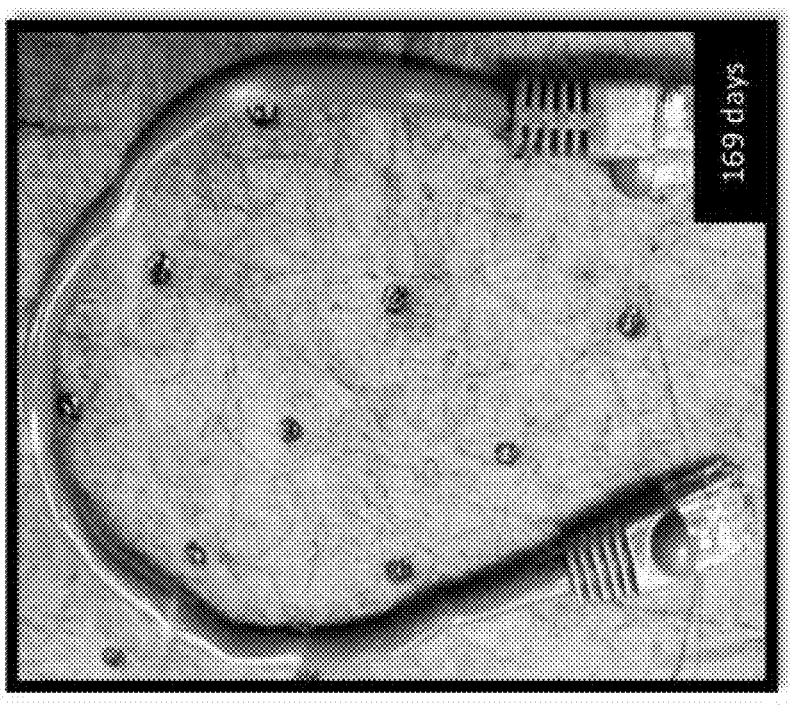
FIGS. 27A and 27B are photographs of a cord after being immersed in a cooling fluid according to an embodiment of the present disclosure for 40 days (FIG. 27A) and 169 days (FIG. 27B) respectively.
Figure 27A:
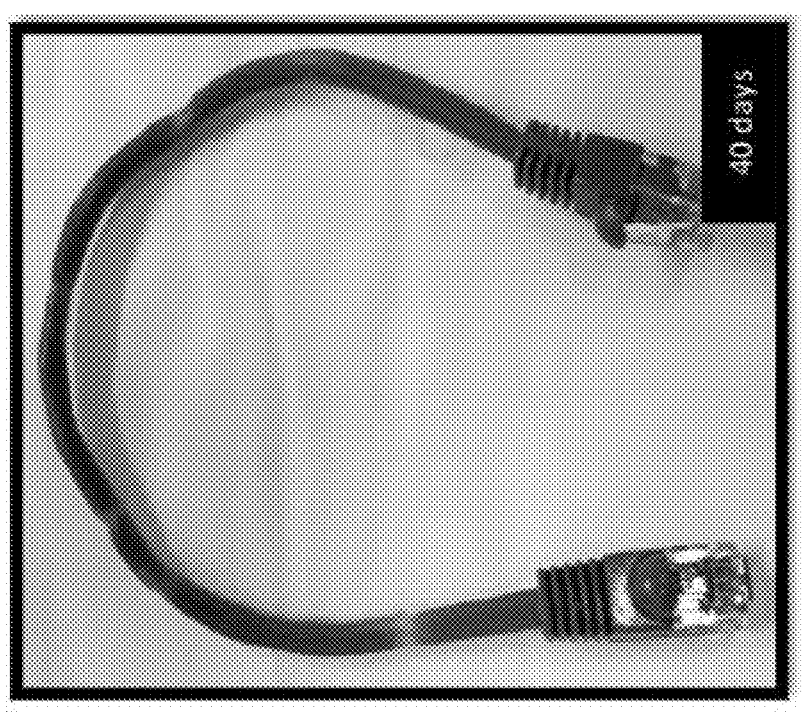
Figure 28B:
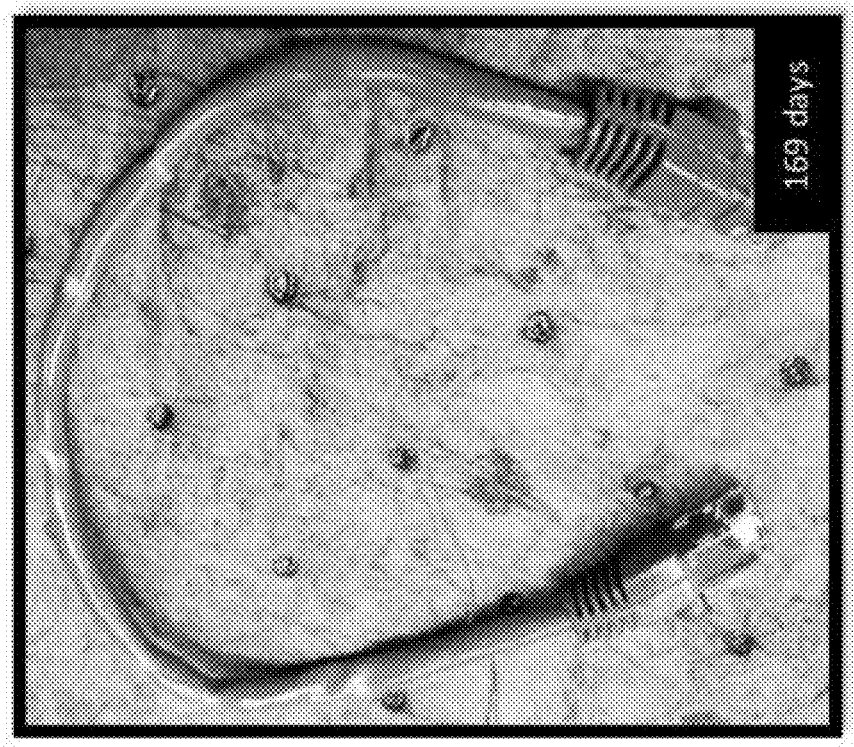
FIGS. 28A and 28B are photographs of a cord after being immersed in a cooling fluid according to an embodiment of the present disclosure for 40 days (FIG. 28A) and 169 days (FIG. 28B) respectively.
Figure 28A:
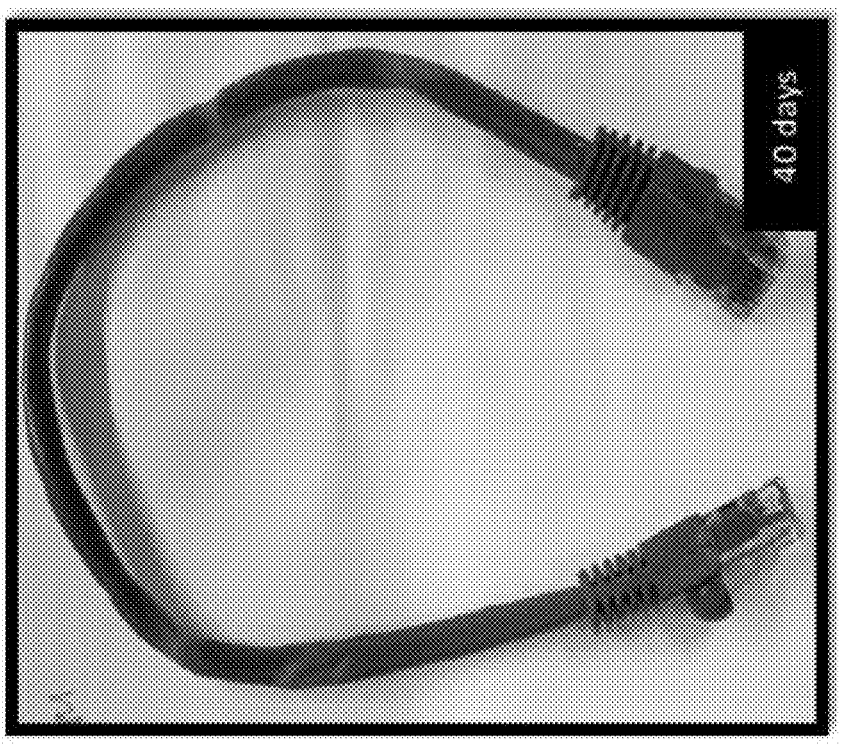
Figure 29B:
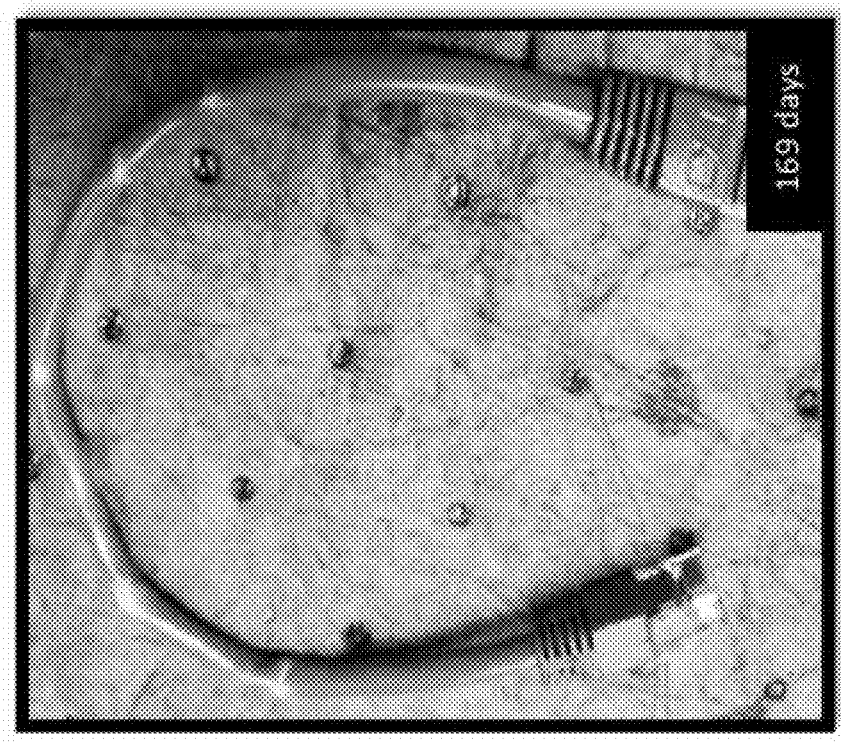
FIGS. 29A and 29B are photographs of a cord after being immersed in a cooling fluid according to an embodiment of the present disclosure for 40 days (FIG. 29A) and 169 days (FIG. 29B) respectively.
Figure 29A:
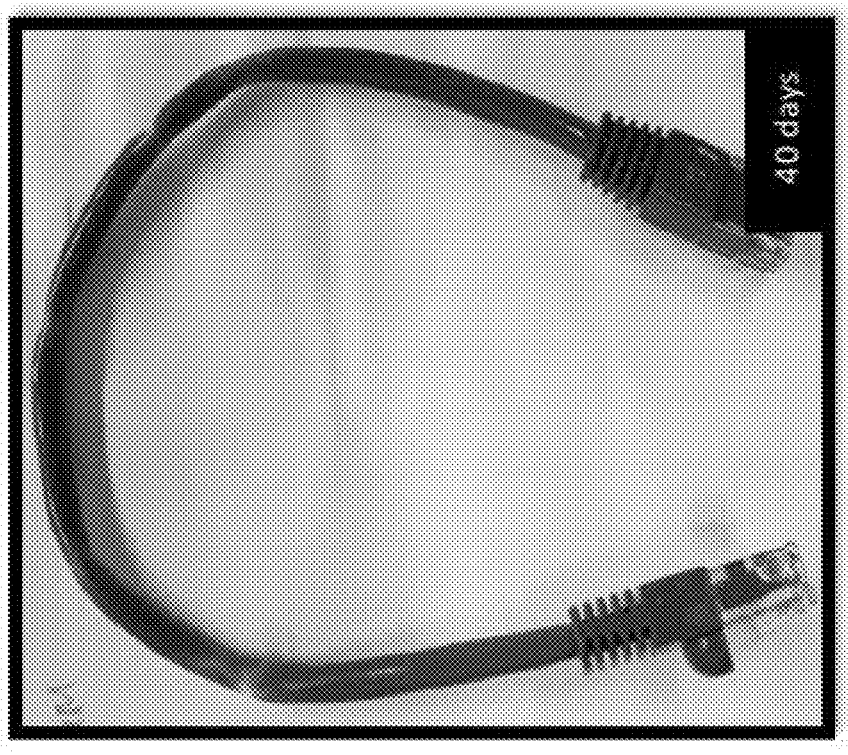
Figure 30B:
FIGS. 30A and 30B are photographs of a cord after being immersed in a cooling fluid according to an embodiment of the present disclosure for 40 days (FIG. 30A) and 169 days (FIG. 30B) respectively.
Figure 30A:
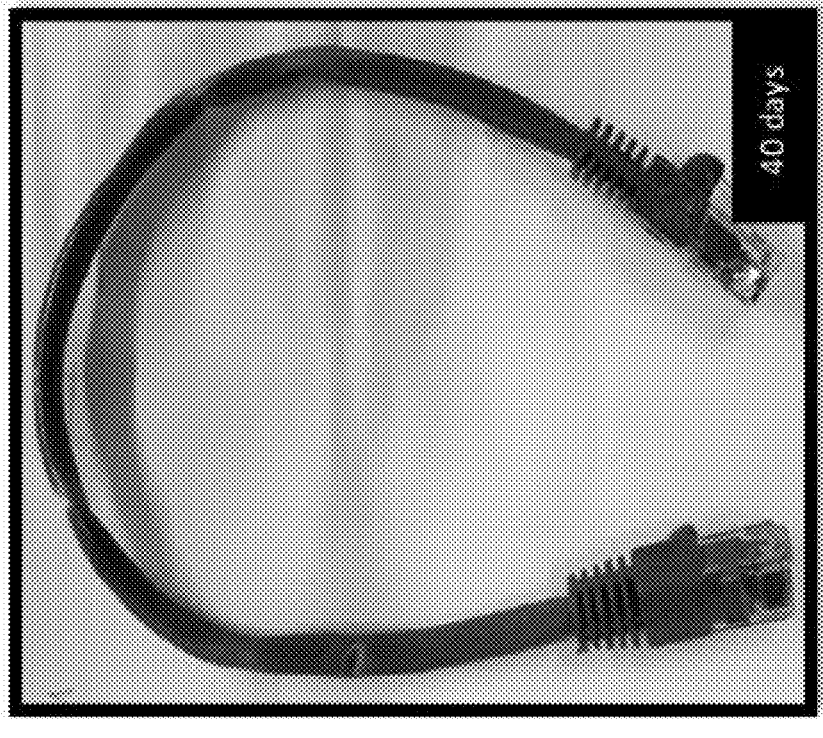

A low-density polyethylene (PE-LD) cord was submerged in Consol 340 at 55-60° C. for 169 days. The cord after 40 days can be seen in FIG. 27A and the cord after 169 days can be seen in FIG. 27B.

Example 6B

Each low-density polyethylene cord (PE-LD) cord was submerged in a sample cooling solution containing Consol 340 as the coolant and Hexamoll Dinch (1,2-Cyclohexane dicarboxylic acid, diisononyl ester) as the plasticizer at 55-60° C. for 169 days. The sample cooling solutions tested were: (A) 5.0 v/v % Hexamoll Dinch in Consol 340; (B) 10.0 v/v % Hexamoll Dinch in Consol 340 and (C) 15.0 v/v % Hexamoll Dinch in Conosol 340.

Samples A, B, C were prepared by adding 22.5-mL, 45-mL, and 67.5-mL respectively of Hexamoll Dinch to sufficient Consol 340 to provide a total volume of 450 mL. Each mixture was vigorously shaken until the solution appeared homogeneous.

The samples were then transferred to glass jars and a test cord was submerged in each mixture before each jar was covered. Each jar was placed in a water bath between a temperature of 55-60° C. The cords were observed visually and physically examined. Photographs of the cords after immersion in Samples A, B, C, for 40 days are shown in FIGS. 24A, 25A and 26A respectively. Photographs of the cords after immersion in Samples A, B and C for 169 days are shown in FIGS. 24B, 25B and 26B respectively. Observations of these samples and the Comparison Sample (Example 6A) are listed in Table 7.

TABLE 7

| | Observations at Specified Loading of Plasticizer | | | |
|---|---|---|---|---|
| Time (days) | Comparison Sample (0 v/v %) | Sample A (5.0 v/v %) | Sample B (10.0 v/v %) | Sample C (15.0 v/v %) |
| 10 | Cord is still very flexible and easy to bend. No marks or indents made when bending. | Cord is still easily bent but harder to bend than the 5% DEHP. Slight indents seen after bending cord. | Cord is a lot easier to bend than the 5%. No indentations seen after bending. | Cord is very flexible and very easily bent. No indentations/ marks seen after bending cord. |
| 17 | Cord is a bit stiffer but not difficult to bend. No indents or marks made. | Cord is a bit stiff. Easier to bend than the blank but more difficult to bend than the 5% DEHP. | Cord is easier to bend than the 5% and is still very flexible. | Cord is still easily bent and much easier to bend than the former. Cord is very flexible. |
| 21 | Cord is slightly stiffer but still easily bent. One slight indent seen after bending cord. | Cord is still easily bent and is quite flexible. Not as easy to bend as the 5% DEHP. One indent seen after bending cord. | Cord is a lot easier to bend than the former. Cord is flexible and no indentations seen after bending cord. | Cord is a lot easier to bend than the 5%. Cord is the most flexible and no indentations or marks visible. |
| 28 | Cord is still very flexible and easily bend. Slight indentations seen after bending. | Cord is slightly stiff but still easily bent. Not as bendable as the 5% DEHP. | Cord is more easily bent than the 5%. No indents or marks after bending. | Cord is very flexible and the easiest to bend. No indentations or marks after bending. |
| 35 | Cord is a lot stiffer and a bit harder to bend. More prominent indents seen after bending. | Cord is stiff and relatively difficult to bend. Some impressions and indents seen after bending. | Cord is easier to bend than the former. Slight impressions but no indents after bending. | Cord is very flexible and easily bent. Slight impressions but no indents after bending. |
| 40 | Cord is very stiff and difficult to bend. Lots of indents made after bending but no cracking or rips seen. | Cord is a bit easier to bend than the former. Some impressions/ indents seen after bending cord. | Cord is the easiest to bend and a lot more flexible than the 5%. Slight impressions made after bending cord. | Cord is a bit less flexible than the 10% Hexamoll Dinch. Some indents seen after bending the cord. |
| 169 | Cord is quite stiff but relatively easy to bend. No rips or tears after being bent, though some indentations seen. | Cord is quite stiff and relatively hard to bend. More indents seen after bending but no cracking or tears visible. | Cord is a bit stiff but a lot easier to bend than the 5% Hexamoll Dinch. A few indents seen but no cracking/ tears is visible. | Cord is a bit stiff but a lot easier to bend than the 5% Hexamoll Dinch. A few indents seen but no cracking/ tears is visible. |

After about 40 days, the cord immersed in Sample C (15.0 v/v % of Hexamoll Dinch added to the Consol 340) appeared to make the cord stiffer than the cord immersed in Sample B (10.0 v/v % of Hexamoll Dinch added to the Chevron Neutral Oil 60R). No noticeable cracking had been seen on the submerged cord using 10% DEHP in the same oil—Consol 340—even being submerged in the fluid for the same amount of time (see example 2B).

It was observed that as the amount of DEHP added to either DRILLSOL Plus or Chevron Neutral Oil 60R was increased, the resulting cords became progressively more resistant to deterioration and cracking. In both examples, the highest concentration of DEHP tested produced the best results. Based on these observations, through visual inspection and manual testing, it is suspected that that the plasticizer is causing these results. It is expected that higher concentrations of DEHP may improve the resistance of the cords to deterioration and cracking.

The term "substantially free" refers to a composition in which a particular constituent or moiety is present in an amount that has no material effect on the overall composition. In some embodiments, "substantially free" may refer to a composition in which the particular constituent or moiety is present in the composition in an amount of less than about 10 wt % or less than about 5 wt %, or less than about 4 wt %, or less than about 3 wt % or less than about 2 wt % or less than about 1 wt %, or less than about 0.5 wt %, or less than about 0.1 wt %, or less than about 0.05 wt %, or even less than about 0.01 wt % based on the total weight of the composition, or that no amount of that particular constituent or moiety is present in the respective composition.

The term "wt %" means weight percent.

The term "about" as used herein can allow for a degree of variability in a value or range, for example, within 5% of a stated value or of a stated limit of a range.

When introducing elements of the present invention or the embodiments thereof, the articles "a," "an," "the," and "said" are intended to mean that there are one or more of the elements. The terms "comprising," "including," and "having" are intended to be inclusive and mean that there may be additional elements other than the listed elements.

Of course, the above described embodiments are intended to be illustrative only and in no way limiting. The described embodiments of carrying out the invention are susceptible to many modifications of form, arrangement of parts, details, and order of operation. The invention, therefore, is intended to encompass all such modifications within its scope.

What is claimed is:

1. A cooling fluid comprising:
   a coolant for immersion cooling an object within a container, the object comprising a pre-plasticized surface, wherein the coolant is a liquid coolant; and
   a plasticizer dispersed in the coolant, the plasticizer being free to move in the liquid coolant such that the plasticizer is movable through the liquid coolant into the pre-plasticized surface of the object when the object is in contact with the coolant, wherein a weight ratio of the plasticizer to the coolant in the cooling fluid is at least 0.005.

2. The cooling fluid of claim 1, wherein the weight ratio of the plasticizer in the cooling fluid to the coolant is at least 0.1.

3. The cooling fluid of claim 1, wherein the weight ratio of the plasticizer in the cooling fluid to the coolant is at least 0.15.

4. The cooling fluid of claim 1, wherein the weight ratio of the plasticizer in the cooling fluid to the coolant is at least 0.2.

5. The cooling fluid of claim 1, wherein the weight ratio of the plasticizer in the cooling fluid to the coolant is from 0.005 to 0.2.

6. The cooling fluid of claim 1, wherein the plasticizer in the cooling fluid is the same as a plasticizer in the pre-plasticized surface of the object.

7. The cooling fluid of claim 6, wherein a concentration of the plasticizer in the cooling fluid is the same or higher than a concentration of the plasticizer in the pre-plasticized surface of the object.

8. The cooling fluid of claim 1, wherein the plasticizer in the cooling fluid comprises a low molecular weight ortho-phthalate, a high molecular weight ortho-phthalate, a tere-phthalate, a trimellitate, an aliphatic, a benzoate, a phosphate, or a polymeric plasticizer.

9. The cooling fluid of claim 8, wherein the low molecular weight ortho-phthalate comprises butyl benzyl phthalate (BBP), dimethyl phthalate (DMP) diethyl phthalate (DEP), diisobutyl phthalate (DIBP), dihexyl phthalate (DHP), di-n-butyl phthalate (DBP), dicyclohexyl phthalate (DCHP), di(2-ethylhexyl) phthalate (DEHP), 1,2-cyclohexane dicarboxylic acid diisononyl ester (DINCH) or di(2-propylheptyl) phthalate (DPHP).

10. The cooling fluid of claim 1, wherein a concentration of the plasticizer in the cooling fluid is 5 wt % to 15 wt % based on a total weight of the cooling fluid.

11. The cooling fluid of claim 1, wherein the coolant comprises an oil.

12. The cooling fluid of claim 1, wherein the coolant has a density of between 0.800 and 1.100 kg/L at 15° C.

13. A cooling system comprising:
   a container comprising a chamber for receiving therein an object to be cooled;
   the cooling fluid of claim 1 in the chamber for immersing the object in the cooling fluid.

14. The system of claim 13, wherein the object comprises a computing device.

15. A method of cooling an object comprising a pre-plasticized surface, the method comprising:
   immersing the object in the cooling fluid of claim 1 within the container, wherein the pre-plasticized surface is in contact with the cooling fluid.

16. The method of claim 15, wherein the pre-plasticized surface of the object comprises a plasticized polymer.

17. The method of claim 15, wherein the object comprises a computing device.

18. The method of claim 17, wherein the computing device is immersion cooled in the cooling fluid at a temperature of at least 50° C. for at least 30 days.

19. A method of forming a cooling fluid for immersion cooling an object, wherein the object comprises a plasticized polymer, the method comprising:

selecting and providing a liquid coolant suitable for immersion cooling the object;

mixing the liquid coolant with a plasticizer to form a liquid mixture, wherein a weight ratio of the plasticizer to the liquid coolant in the liquid mixture is at least 0.005, wherein the plasticizer is free to move in the liquid coolant such that the plasticizer is diffusible through the liquid coolant into the plasticized polymer when the object is immersed in the liquid mixture within a container and a concentration of the plasticizer in the liquid mixture is higher than a concentration of the plasticizer in the plasticized polymer.

\* \* \* \* \*